United States Patent [19]
Zhang et al.

[11] Patent Number: 6,040,589
[45] Date of Patent: Mar. 21, 2000

[54] SEMICONDUCTOR DEVICE HAVING LARGER CONTACT HOLE AREA THAN AN AREA COVERED BY CONTACT ELECTRODE IN THE HOLE

[75] Inventors: Hongyong Zhang; Jun Koyama; Satoshi Teramoto, all of Kanagawa, Japan

[73] Assignee: Semiconductor Energy Laboratory Co., Ltd., Kanagawa-ken, Japan

[21] Appl. No.: 08/873,846

[22] Filed: Jun. 12, 1997

[30] Foreign Application Priority Data

Jun. 18, 1996 [JP] Japan ................................. 8-178508
Oct. 8, 1996 [JP] Japan ................................. 8-286001

[51] Int. Cl.⁷ .......................... H01L 21/312; H01L 29/04
[52] U.S. Cl. .............................. 257/59; 257/72; 257/288; 257/382; 257/383; 257/384; 257/385; 257/386; 257/343; 257/347; 257/350; 257/377; 257/576; 257/584
[58] Field of Search ...................... 257/59, 72, 382–386, 257/288, 343, 347, 350, 377, 576, 584

[56] References Cited

U.S. PATENT DOCUMENTS 5,015,597   5/1991   Vinouze et al. ........................... 257/59
5,583,369  12/1996   Yamazaki et al. ....................... 257/352

FOREIGN PATENT DOCUMENTS 404241452   8/1992   Japan ...................................... 257/347
2 233 822   1/1991   United Kingdom ................... 257/347

Primary Examiner—Fetsum Abraham
Attorney, Agent, or Firm—Fish & Richardson P.C.

[57] ABSTRACT

There is disclosed an active matrix liquid crystal display comprising pixels having an improved aperture ratio. A metallization layer makes contact with an active layer through openings. Inside the openings, the active layer is patterned into the same geometry as the metallization layer. That is, the active layer is patterned in a self-aligned manner according to the pattern of the metallization layer. This can enlarge the contact area. Also, the metallization layer does not required to be specially patterned for making contacts. A high aperture ratio can be obtained.

27 Claims, 23 Drawing Sheets

SEMICONDUCTOR DEVICE HAVING LARGER CONTACT HOLE AREA THAN AN AREA COVERED BY CONTACT ELECTRODE IN THE HOLE

BACKGROUND OF THE INVENTION

1. Field of the Invention

The present invention relates to the structure of electrode contact portions of a semiconductor integrated circuit and, more particularly, to the structure of electrode contact portions of thin-film transistors (TFTs) used in an active matrix liquid crystal display. The invention also relates to process steps for fabricating TFTs having such a structure.

2. Description of the Related Art

Active matrix liquid crystal displays have been known. Such a liquid crystal display comprises a substrate made of glass or quartz. TFTs are formed and disposed at pixels on the substrate. Pixel portions of the general active matrix liquid crystal display are manufactured by the fabrication steps described below.

FIGS. 6A and 6B are top views of one pixel portion of this conventional active matrix liquid crystal display, illustrating its process sequence. FIG. 8A is a cross-sectional view taken on line A–A' of FIG. 6A. FIG. 8B is a cross-sectional view taken on line B–B' of FIG. 6B. FIG. 9A is a cross-sectional view taken on line a–a' of FIG. 7.

First, as shown in FIGS. 6A and 8A, a silicon oxide film 12 is formed as a buffer layer on a glass substrate 11. Then, an amorphous silicon film that will act as a starting film for the active layer of TFTs is formed. Thereafter, the amorphous silicon film is irradiated with laser light or heat-treated to convert the amorphous silicon film into a crystalline silicon film.

The resultant crystalline silicon film is then patterned to form an active layer pattern 13. FIG. 6A is a top view of this active layer pattern 13. FIG. 8A is a cross-sectional view taken on line A–A' of FIG. 6A.

A metallization layer is grown to form a gate electrode. This metallization layer can be fabricated from various silicide materials or metallic materials. The metallization layer is patterned to form a gate electrode 14. As shown in FIG. 6B, the gate electrode 14 is formed so as to extend from a gate line 15. This gate line 15, other gate lines (not shown), and source lines (formed later) are arranged in rows and columns in an active matrix region.

Then, using the gate electrode 14 as a mask, dopant ions are introduced, and a source region 16 and a drain region 18 are formed by self-aligned techniques. If an N-channel TFT should be fabricated, P (phosphorus) is implanted. If a P-channel TFT should be manufactured, B (boron) is lodged. During this implantation of the dopant ions, a channel region 17 is defined in a self-aligned manner. As a result, a state represented by the cross-sectional view of FIG. 8B is obtained. FIG. 8B is taken on line B–B' of FIG. 6B. Subsequently, a silicon nitride film or silicon oxide film is formed as an interlayer dielectric film 19. The resultant state is shown in FIG. 8C.

As shown in FIG. 8D, contact holes 20 and 21 are formed in the interlayer dielectric film 19 to make contact with the source region 16 and the drain region 18, respectively. Then, as shown in FIG. 9A, electrodes 22 and 23 in contact with the source region 16 and the drain region 18, respectively, are formed at the same time. FIG. 7 is a top view of the structure shown in the cross-sectional view of FIG. 9A, which is taken along line a–a' of FIG. 7.

As shown in FIG. 7, the contact to the source line 22 is larger in area than the source region 16 in the active layer. Also, the electrode pattern 23 for making contact with the drain region 18 is considerably larger than the pattern of the drain region 18. This is due to a margin set to cope with misalignment of masks caused during formation of the contact holes 20 and 21 and misalignment of the conductive lines 22, 23 with the electrode pattern caused during formation of them.

These kinds of misalignments are produced to a considerable level by shrinkage of the glass substrate and by the misalignment introduced by the exposure machine itself. Generally, where a liquid crystal display is manufactured, a substrate made of glass is used. Also, the substrate has a large area. Therefore, misalignment of the order of micrometers takes place. Consequently, the margin must be set, taking account of the above-described misalignments.

After obtaining the state shown in FIG. 9A, a resinous film 25 is formed as a second interlayer dielectric film 25. The use of the resinous material can flatten the surface. In this way, a state shown in FIG. 9B is obtained.

Then, contact holes reaching the electrodes 23 are formed. Pixel electrodes 26 of ITO are formed, thus resulting in a state shown in FIG. 9C. A process sequence for fabricating TFTs used to construct a peripheral drive circuit or other integrated circuit is schematically shown in the top views of FIGS. 12A, 12B, and 13.

In the state shown in FIG. 12A, a gate insulator film (not shown) is formed on an active layer 1201 consisting of a silicon film. A gate electrode 1202 is placed on the gate insulator film.

The state shown in FIG. 12B is obtained by forming an interlayer dielectric film (not shown) on the structure shown in FIG. 12A and forming contact electrodes 1203 and 1204 in contact with the source and drain regions on the interlayer dielectric film. Also, conductive interconnects extending from the contacted electrodes are formed. Contact holes 1205 and 1206 are formed in the interlayer dielectric film (not shown). Doped regions are connected with the contact electrodes via these contact holes.

In this structure, to allow sufficient margin for the accuracy at which the active layer 1201 is aligned, the accuracy at which the contact holes 1205 and 1206 are aligned, and the accuracy at which the electrodes 1203 and 1204 are aligned, extra area given by dimension a is necessary. In particular, sufficient margin is necessary so that the active layer 1201 and the contact hole 1206 are aligned. Also, sufficient margin is needed to permit the contact hole 1206 and the electrode 1204 to be aligned. Hence, the dimension a is necessitated.

The active matrix liquid crystal display is required to increase the aperture ratio of the pixel area as high as possible. In the abovedescribed structure, however, the electrodes used for contacts occupy a large area. This makes it impossible to enhance the transmittance.

Generally, an aperture ratio of 100% is impossible to achieve because the source line 22 and gate line 15 take up areas, as shown in FIG. 7. Accordingly, in order to increase the aperture ratio, it is necessary to minimize the area occupied by the electrode pattern that is necessary for making contacts.

For example, in the structure shown in FIG. 7, the source line 22 and electrode 23 have areas not used for contacts and result in a decrease in the aperture ratio. These areas are necessary to secure sufficient margin for alignments. After this alignment step, these areas are dead spaces and block light, thus deteriorating the aperture ratio.

Also, ordinary integrated circuits have the following problems. Some active matrix liquid crystal displays have built-in peripheral drive circuits. That is, a peripheral drive circuit for driving an active matrix circuit is integrated with the active matrix circuit on the same substrate. Of course, the peripheral drive circuit is composed of TFTs. To miniaturize the whole device, the peripheral drive circuit needs to have a higher packaging density.

With the general TFT pattern as shown in FIG. 12, however, various difficulties are encountered in enhancing the packaging density. One difficult is that the dimension a cannot be reduced to an infinitesimal value. This dimension is associated with the shrinkage of the glass substrate and mask alignment accuracy during fabrication steps and so it is difficult to reduce the dimension below a certain value. Especially, in the case of an integrated circuit using a large-area substrate made of glass that shrinks, it is important to secure the aforementioned alignment accuracy. Also, where smaller design rules are adopted, it is customary to reduce the contact holes accordingly. However, reducing the contact holes produces several problems such as increase in the contact resistance and poor contact.

For instance, if 5-micrometer design rules are replaced by 3-micrometer design rules, the contact area decreases from $(5 \mu m)^2 = 25 \mu m^2$ to $(3 \mu m)^2 = 9 \mu m^2$. That is, the contact area decreases to near one third. If the design rules are varied from 5 $\mu m$ rules to 3 $\mu m$ rules in this way, the treated current is not reduced to one third. Therefore, in this case, the current density in the contacts is approximately tripled. Under this condition, local heating tends to destroy the contacts and produce defects.

We have experimentally confirmed that, where smaller design rules are used, the contacts are destroyed at many locations, resulting in defects. Since it is necessary to provide smaller circuit areas, there will be an increasing need for smaller design rules. As the design rules diminish as described above, the contact area decreases in proportion to the squares of the design rules. This circumstance will pose more serious problems.

SUMMARY OF THE INVENTION

It is an object of the present invention to provide a semiconductor device structure that secures sufficient margin for alignments required to make contacts and yet eliminates unwanted electrode pattern portions, thus increasing the aperture ratio as high as possible.

It is another object of the invention to provide a semiconductor device structure comprising TFTs packed at a higher device density on a glass substrate.

It is a further object of the invention to provide a semiconductor device structure capable of providing a maximum contact area even if the device density is enhanced (i.e., the design rules are reduced).

One embodiment of the present invention is substantiated as shown in FIG. 4C, where a semiconductor layer exists under an interlayer dielectric film 311. A contact is made to this semiconductor layer. This contact is created inside an opening 312 where a part 308 of the semiconductor layer is exposed. A patterned metallization layer 317 is in contact with the part 308 of the semiconductor layer within the opening. The semiconductor layer is patterned into the same geometry as the metallization layer 317 inside the opening 312 FIG. 2.

In the above-described structure, the area of the opening 312 is set larger than the area of contact through which the semiconductor layer is in contact with the metallization layer. This allows sufficient margin for alignments.

The aforementioned embodiment is substantiated differently as shown in FIG. 14, where a semiconductor layer 1401 exists under an interlayer dielectric film. A contact is made to the semiconductor layer 1401 inside an opening 1407 where the semiconductor layer is partially exposed. A metallization layer 1409 patterned inside the opening makes contact with the semiconductor layer. The semiconductor layer inside the opening is patterned into the same geometry as the metallization layer.

A further embodiment is shown in FIGS. 2 and 4C, where a semiconductor layer 308 resides under an interlayer dielectric film 311. An opening 312 is formed in the interlayer dielectric film. A metallization layer 317 makes contact with the semiconductor layer 308 inside the opening 312. Within this opening, at least parts of the end surface of the semiconductor layer exactly or roughly agree in shape with the end surface of the metallization layer.

With this structure, smaller design rules can be accomplished while securing sufficient contact area. This structure is inevitably produced by patterning the metallization layer 317 inside the contact opening 312.

A yet other embodiment is shown in FIGS. 2 and 4C, where a semiconductor layer 308 is present under an interlayer dielectric film 311. An opening 312 is formed in the interlayer dielectric film. A metallization layer 317 makes contact with the semiconductor layer 308 inside the opening 312. Within this opening, the metallization layer does not overlap at least one side of the opening. This structure is inevitably produced by patterning the metallization layer 317 inside the contact opening 312.

A still other embodiment is shown in FIG. 2, where TFTs are arranged at the pixels of an active matrix liquid crystal display. The TFTs have doped regions patterned into the source line 317 and other source lines (not shown) at locations where the doped regions make contact with an active matrix circuit formed by the metallization layer 317.

An additional embodiment is shown in FIG. 2, where TFTs are arranged at the pixels of an active matrix liquid crystal display. The TFTs have doped regions that are partially patterned, by self-aligned technology, into metal electrodes or interconnects, 317 and 318, to be contacted.

A method of making contacts in accordance with the invention is shown in FIGS. 3A–3D and 4A–4C, where a semiconductor layer 308 exists under an interlayer dielectric film 311. The contacts are made to the semiconductor layer 308. This method starts with forming an opening 312 to partially expose the semiconductor layer. Then, conductive interconnects 317 in contact with the semiconductor layer within the opening are formed. When the conductive interconnects 317 are formed, the semiconductor layer 308 is patterned into the same geometry as the interconnects 317, as shown in FIG. 2.

A still further embodiment of the invention is shown in FIGS. 21A and 21C, where one pixel of an active matrix circuit is depicted, and lies in a semiconductor device using bottom-gate TFTs. A semiconductor layer 1807 (source region) exists under an interlayer dielectric film. A contact is made to the semiconductor layer 1807 within an opening 1812 that partially exposes the semiconductor layer 1807. A metallization layer 1817 patterned inside the opening makes contact with the semiconductor layer 1807. This semiconductor layer inside the opening is patterned into the same geometry as the metallization layer.

In this structure, the opening area is greater than the area of the contact. The metallization layer making contact with the semiconductor layer does not overlap at least one side of the opening. The semiconductor layer used in the present invention can be made of amorphous silicon, crystalline silicon, or other substance. Partially crystallized silicon and partially amorphized silicon may also be employed.

A still additional embodiment of the invention lies in a semiconductor device using bottom-gate TFTs to form an active matrix liquid crystal display. The bottom-gate TFTs are arranged in the pixels of the liquid crystal display. The TFTs have doped regions that are patterned into source lines at locations where the doped regions make contact with the source lines of the active matrix circuit.

The invention further provides an active matrix liquid crystal display having bottom-gate TFTs disposed at the pixels of the liquid crystal display. The TFTs have doped regions making contact with a metallization layer. Parts of the doped regions are patterned into the same geometry as the metallization layer in a self-aligned manner.

The invention further provides a method of fabricating bottom-gate TFTs. This method starts with forming openings in a semiconductor layer existing under an interlayer dielectric film to partially expose the semiconductor layer. A patterned metallization layer which will make contact with the semiconductor layer inside the openings is then formed. When the patterned metallization layer is formed, the semiconductor layer is patterned into the same geometry as the metallization layer.

As shown in FIGS. 4A–4C, the area of a conductive interconnect 317 can be reduced to a minimum by patterning (FIG. 2) the doped region 308 into the interconnect 317 in a self-aligned manner within the opening 312. During patterning of the metallization layer 317, a doped region unnecessary for a contact is etched away to leave only the doped region necessary for the contact inside the opening 312. The self-alignment makes unnecessary those regions of the metallization layer 317 which do not contribute to the contact. In the past, those regions not contributing to the contacts have been large. Thus, an active matrix circuit having a high aperture ratio can be obtained.

Parts of the active layer (doped regions forming source and/or drain regions) are patterned into a size necessary for the contacts according to the geometry of the contacted metallization layer, so that the active layer blocks less light. This results in a higher aperture ratio. The area (the area of the portions of the metallization layer making contact with the semiconductor layer) used for the contacts can be made large, while the regions of the metallization layer not used for the contacts are removed. Consequently, the design rules can be reduced.

Other objects and features of the invention will appear in the course of the description thereof, which follows.

DETAILED DESCRIPTION OF THE PREFERRED EMBODIMENTS

EMBODIMENT 1

Figure 1A:
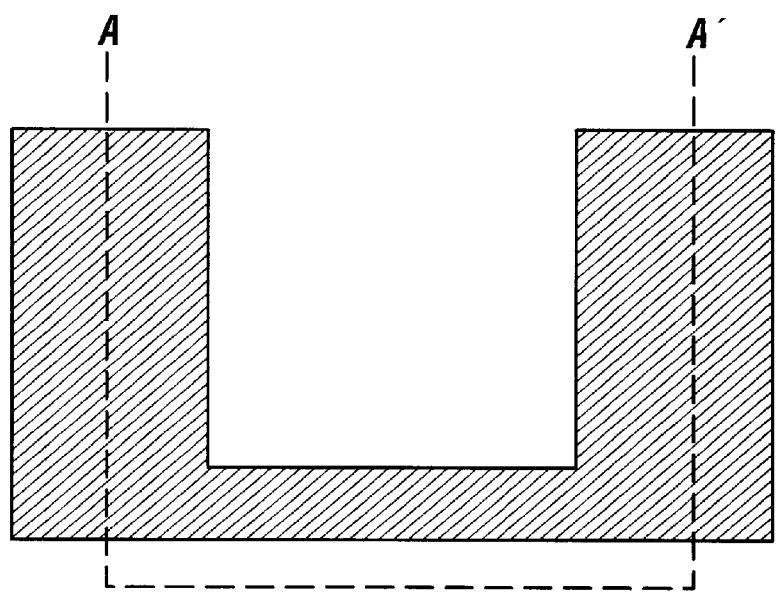
FIGS. 1A and 1B are top views illustrating process steps for fabricating one pixel of an active matrix liquid crystal in accordance with the present invention.
Figure 1B:
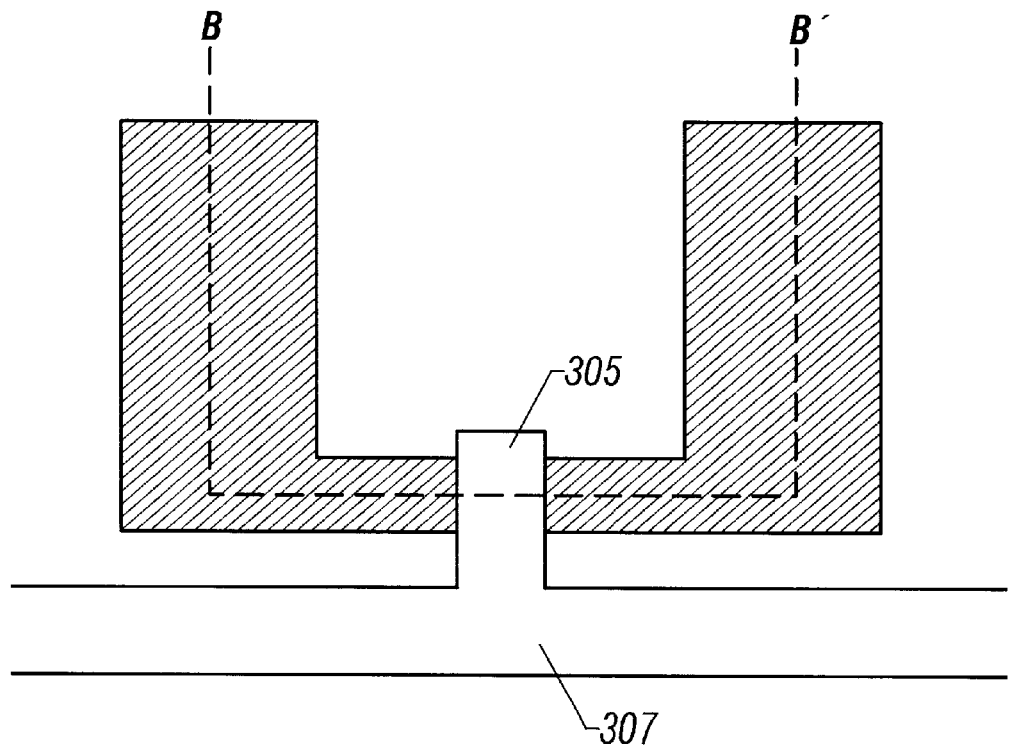
Figure 2:
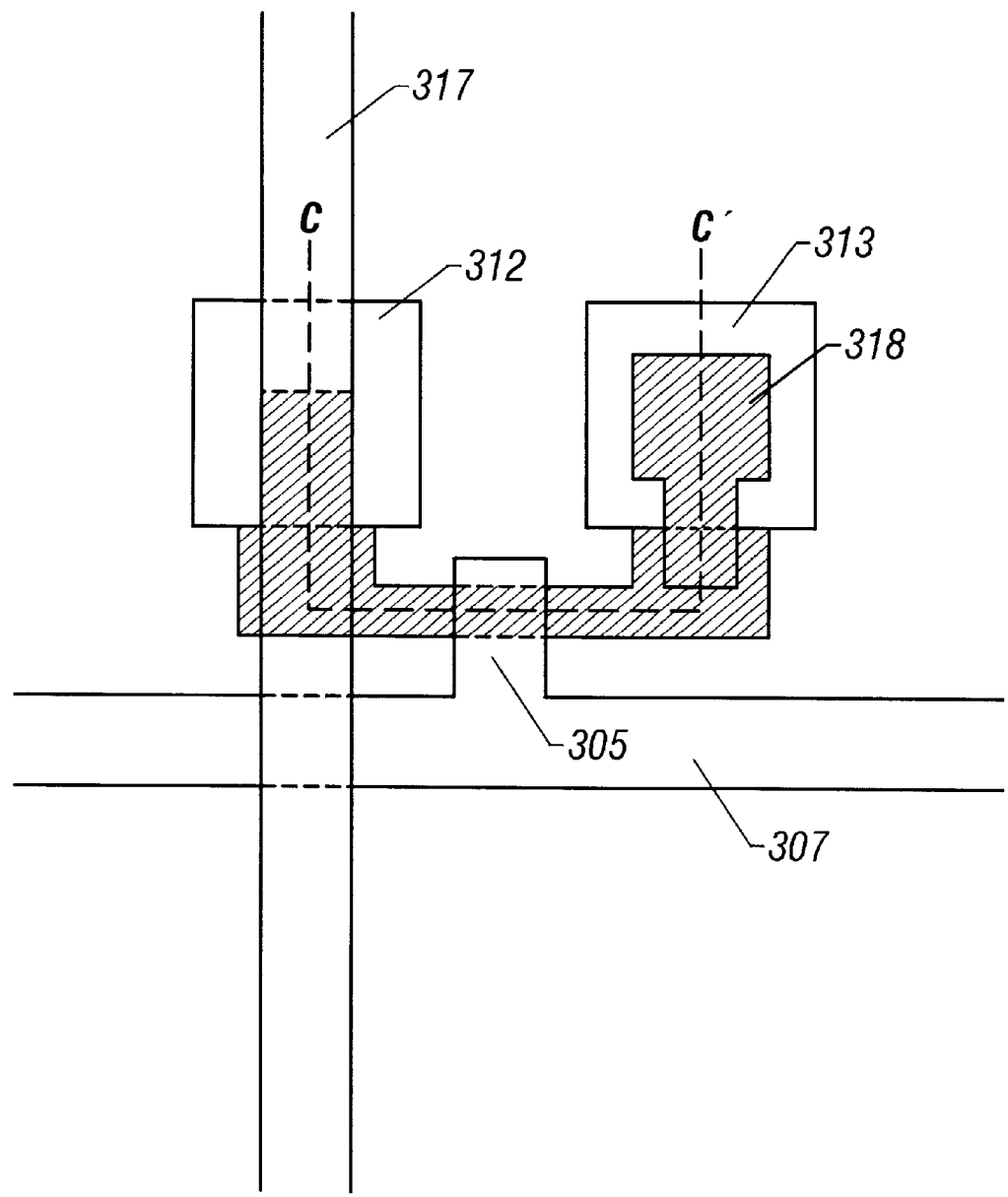
FIG. 2 is a top view illustrating a process step for fabricating one pixel in accordance with the invention.

The present embodiment relates to the structure of one pixel in an active matrix liquid crystal display. FIGS. 1A, 1B, and 2 are top views of the pixel structure, illustrating process steps. FIGS. 3A–3D, 4A–4C, and 5A–5C are cross-sectional views illustrating other process steps.

Figure 3A:
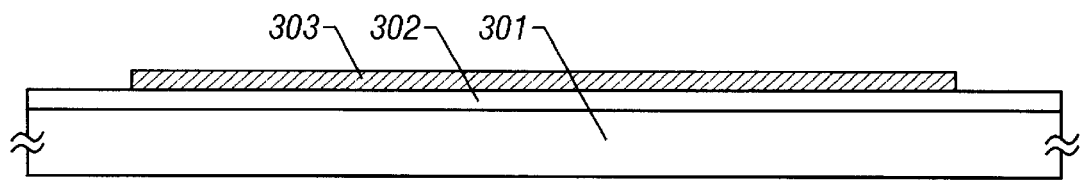
FIGS. 3A–3D are cross-sectional views illustrating process steps for fabricating one pixel in accordance with the invention.

First, as shown in FIG. 3A, a silicon oxide film 302 is formed as a buffer layer to a thickness of 3000 Å on a glass substrate 301. Then, an amorphous silicon film (not shown) is formed to a thickness of 500 Å by plasma CVD. The amorphous film is irradiated with laser light to crystallize the film. Thus, a crystalline silicon film is obtained.

The resulting crystalline silicon film is patterned to form an active layer 303 for a TFT. This state is shown in FIG. 3A.

The geometry of the active layer pattern is shown in FIG. 1A. FIG. 3A is a cross-sectional view taken on line A–A' of FIG. 1A. A silicon oxide film 304 acting as a gate insulator is formed to a thickness of 1000 Å by plasma CVD (FIG. 3B).

Then, an aluminum film (not shown) for forming gate lines and gate electrodes extending from the gate lines is formed to a thickness of 4000 Å by sputtering. In this example, the aluminum film contains 0.18% by weight of scandium. This suppresses formation of needle-like protrusions known as hillocks and whiskers which would normally be caused by overgrowth of aluminum during fabrication steps performed later.

The formed aluminum film is patterned to form a gate electrode 305 extending from the gate line 307 as shown in FIG. 1B. FIG. 3B is a cross-sectional view taken on line B–B' of FIG. 1B. Then, an anodization process is carried out within an electrolyte, using the gate electrode 305 as an anode. An anodic oxide film 306 is grown to a thickness of 1000 Å. This anodic oxide film 306 physically and electrically protects the surface of the aluminum pattern. More specifically, the anodic oxide film prevents shorts between conductive interconnects and formation of hillocks and whiskers. The thickness of this anodic oxide film 306 will form an offset gate region in a later dopant ion implantation step conducted later. Instead of the anodic oxide film, a plasma oxide film created by plasma processing in an oxidizing ambient may be employed.

Figure 3B:
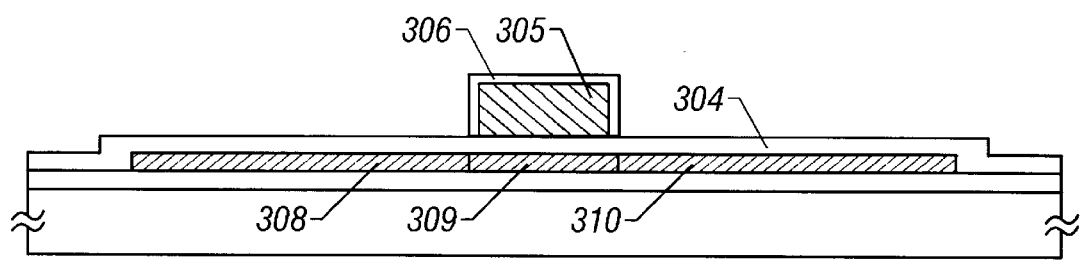

Under the condition shown in FIG. 3B, dopant ions are implanted. In the present embodiment, B (boron) ions are implanted to fabricate a P-channel TFT. Where the N-channel type should be fabricated, P (phosphorus) ions are implanted. In this process step, B ions are implanted into regions 308 and 310 that will become source and drain regions, respectively. A region 309 will become a channel region. The aforementioned offset gate region having a thickness equal to that of the anodic oxide film 306 is formed between the channel region 309 and each of the source/drain regions.

Figure 3C:
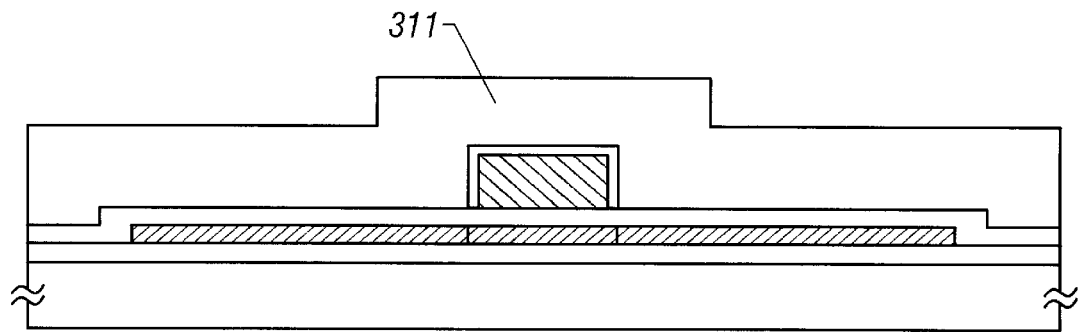
Figure 3D:
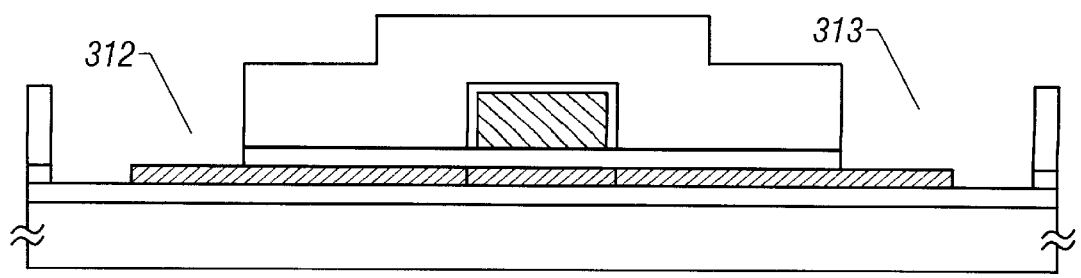

Then, a silicon nitride film is formed as a first interlayer dielectric film 311 to a thickness of 5000 Å by plasma CVD. In this way, a state shown in FIG. 3C is obtained. Thereafter, contact holes 312 and 313 extending to the source region 308 and the drain region 310, respectively, are formed, resulting in a state shown in FIG. 3D. The shape of the contact holes 312 and 313 and the positional relation between them are shown in FIG. 2. Preferably, dry etching is used for the formation of these contact holes.

Figure 4A:
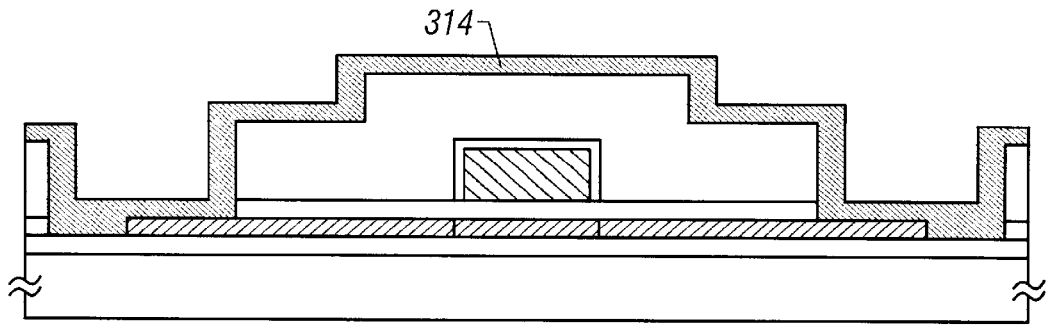
FIGS. 4A–4C are cross-sectional views illustrating process steps for fabricating one pixel in accordance with the invention.

Then, as shown in FIG. 4A, a metallization layer 314 is deposited to a thickness of 4000 Å by sputtering. The metallization layer 314 is a lamination of a 500-Å-thick titanium film, a 3000-Å-thick aluminum film, and a 500-Å-thick titanium film. The use of the titanium films facilitates making ohmic contact with semiconductors and various conductive materials. The aluminum film is used because of its low resistivity. Since this metallization layer forms source lines, it is very important to lower its resistivity.

Figure 4B:
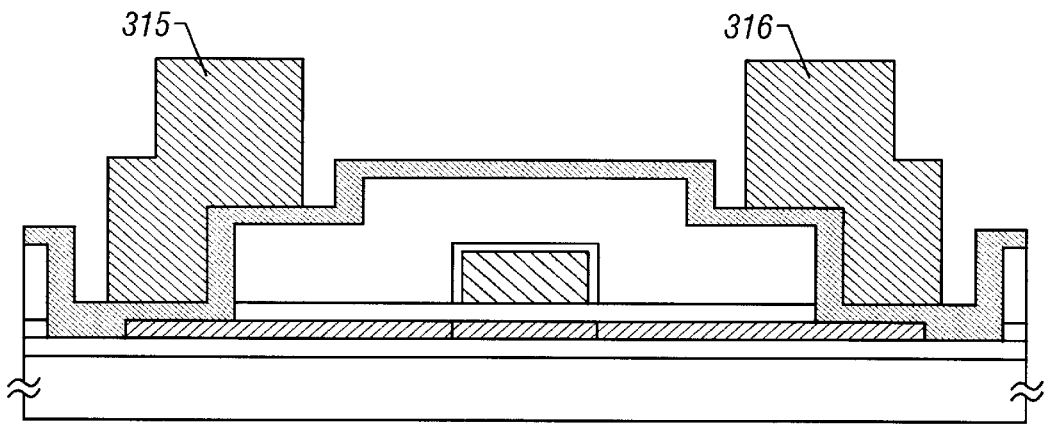
Figure 4C:
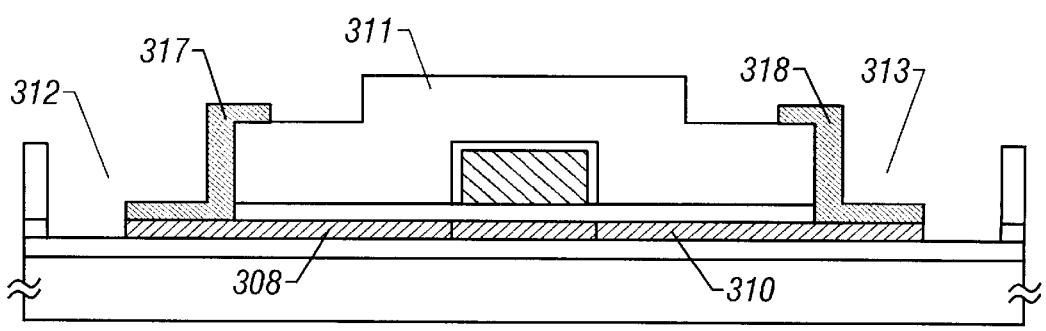

After obtaining the state shown in FIG. 4A, resist masks 315 and 316 are placed as shown in FIG. 4B. Using these masks, the metallization layer 314 is patterned to form a source line 317 and an electrode 318. At the same time, the active layer is also patterned, as shown in FIG. 2. In particular, the source region 308 and the drain region 310 that will form one contact are created by the patterning operation in a self-aligned manner according to the geometry of the source line 317 and electrode 318. Preferably, this patterning operation is carried out, utilizing dry etching, to pattern the metallization layer 314 and the active layer continuously. In this way, a state shown in FIG. 4C is obtained. FIG. 4C is a cross-sectional view taken on line C–C' of FIG. 2. In FIG. 4C, the conductor 317 is the source line. As can be seen from this figure, the source line 317 is in direct contact with the source region 308.

In the present embodiment, the contact hole 312 is made large. Inside this hole, the source line 317 is in direct contact with the source region. It is important that the conductive line 317 be nested completely within the contact hole 312. In this contact area, the opening is larger in area than the contacted metal line. The difference in area between the opening and the contacted line provides sufficient margin for alignment.

In this structure, if the contact hole 312 or the conductor 317 shifts out of position, it is assured that the source region 308 and the source line 317 make contact with each other. Also, the area taken up by the source line 317 can be reduced see FIG. 2. Furthermore, in the drain contact region, the area of the contact electrode 318 can be made small. Also in this region, the area of the contact hole 313 for making a contact with the drain region 310 is rendered larger than the area of the portion of the contact electrode 318 in contact with the drain region. Because of this structure, the contact between the drain region and the electrode 318 is assured even if the contact hole 313 or the contact electrode 318 deviates from its proper position. Moreover, the area taken up by the electrode 318 can be suppressed (see FIG. 2).

Figure 5A:
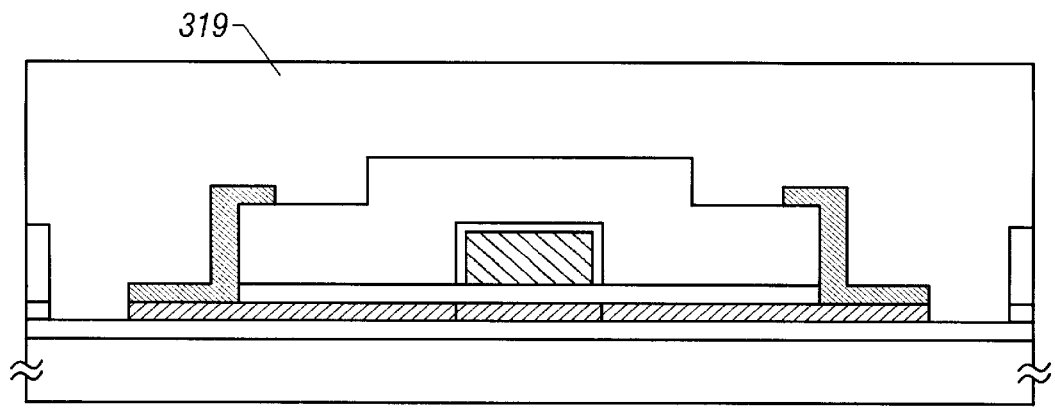
FIGS. 5A–5C are cross-sectional views illustrating process steps for fabricating one pixel in accordance with the invention.
Figure 5B:
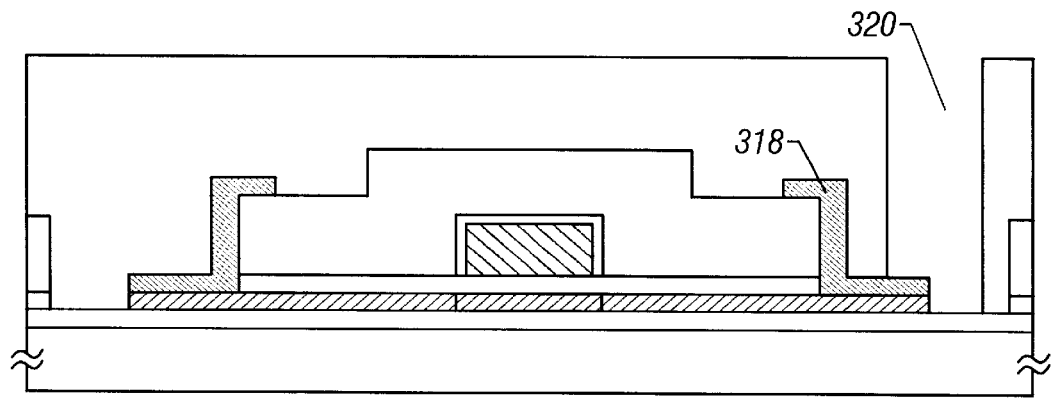
Figure 5C:
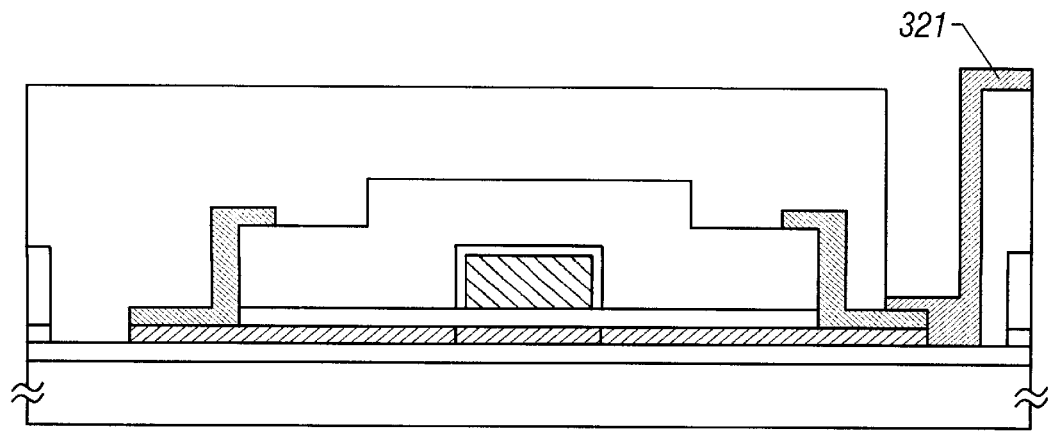
Figure 6A:
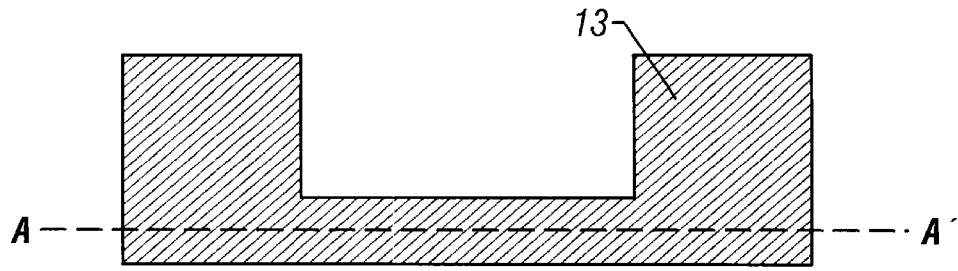
FIGS. 6A–6B are top views illustrating process steps for fabricating one pixel of the prior art active matrix liquid crystal.
Figure 6B:
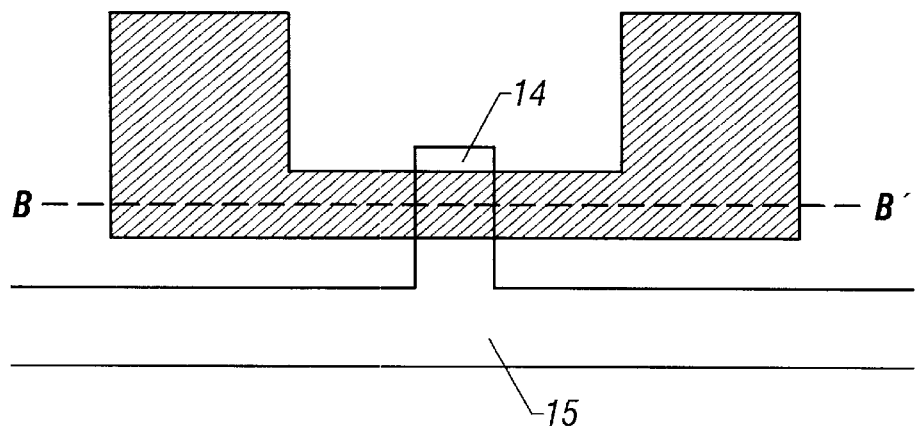

After obtaining the state shown in FIG. 4C, a second interlayer dielectric film 319 is fabricated from a resinous material. The use of the resinous material permits planarization of the top surface. In this manner, a state shown in FIG. 5A is derived. Then, a contact hole 320 is created, as shown in FIG. 5B. The contact electrode 318 is partially exposed at the bottom of the contact hole 320.

Subsequently, a pixel electrode 321 is created from ITO. Thus, pixels of the active matrix circuit are completed. Then, a rubbed film is formed or a rubbing process is performed. The liquid crystal panels are assembled. In consequence, a liquid crystal display is completed.

Figure 7:
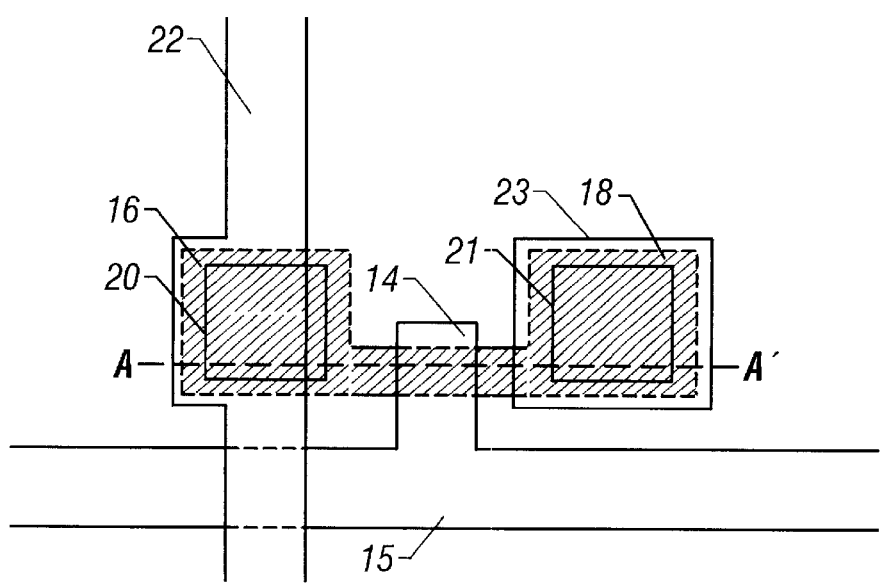
FIG. 7 is a top view illustrating a process step for fabricating one pixel by the prior art techniques.
Figure 8A:
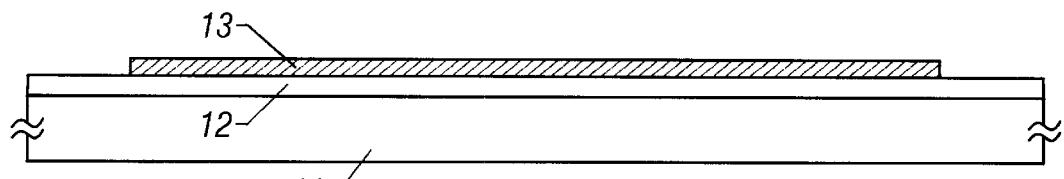
FIGS. 8A–8D are cross-sectional views illustrating process steps for fabricating one pixel by the prior art techniques.
Figure 8B:
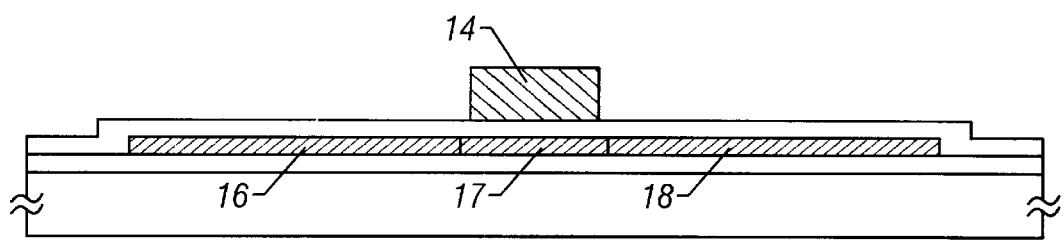
Figure 8C:
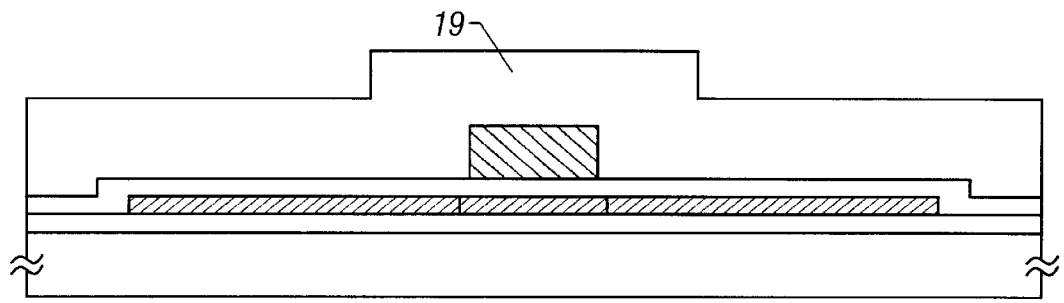
Figure 8D:
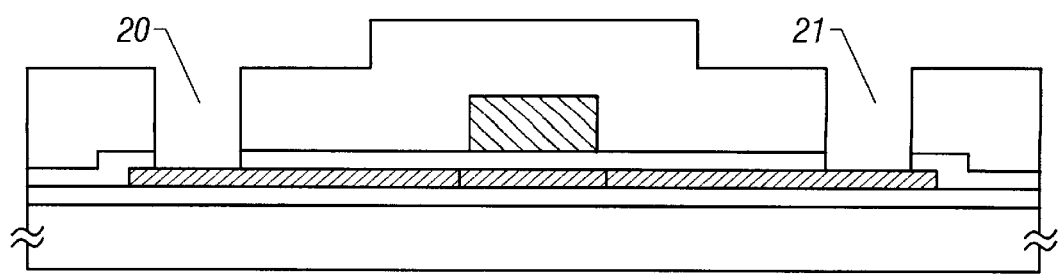
Figure 9A:
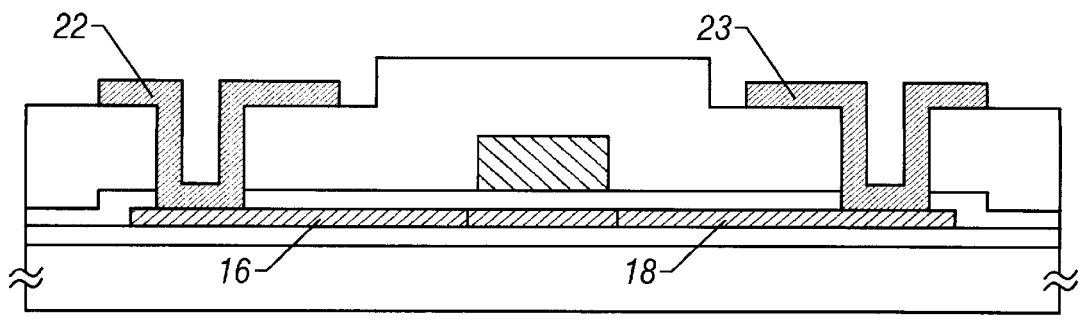
FIGS. 9A–9C are cross-sectional views illustrating process steps for fabricating one pixel by the prior art techniques.
Figure 9B:
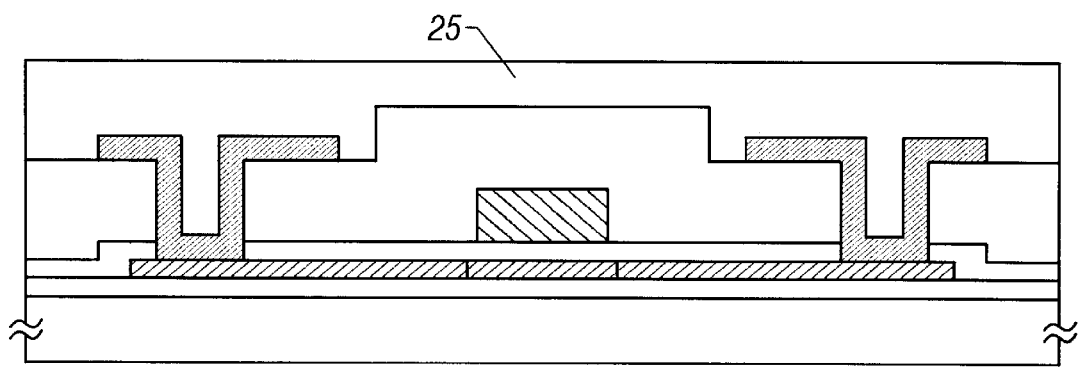
Figure 9C:
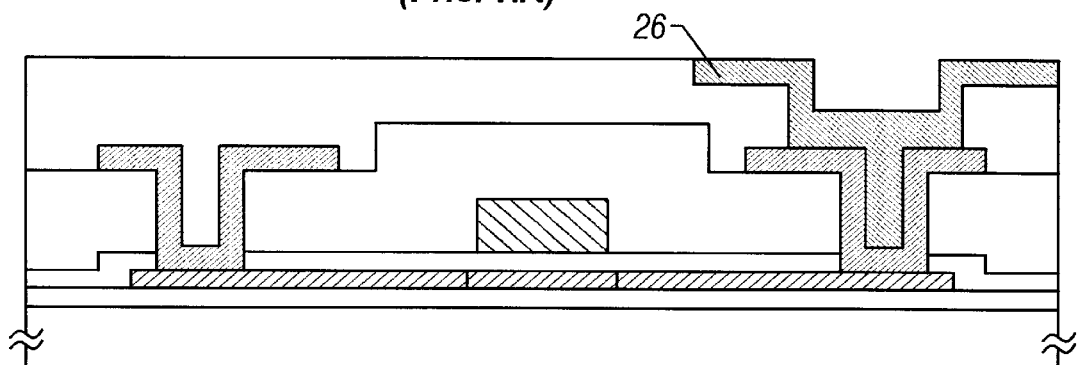

Comparison of FIGS. 7 and 2 reveals that, where the configuration of the present embodiment is adopted, the area of the metallization layer where contacts are made can be reduced. Therefore, the aperture ratio can be increased to a maximum.

EMBODIMENT 2

Figure 10:
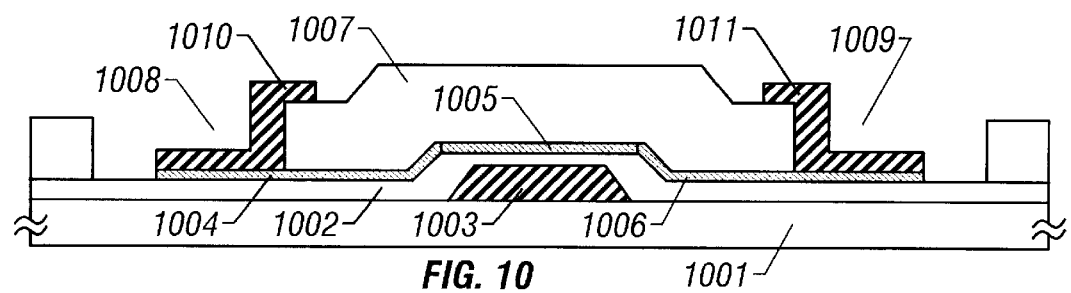
FIG. 10 is a cross-sectional view illustrating a process step for fabricating a pixel at which a bottom-gate TFT is placed in accordance with the invention.

In the present embodiment, bottom-gate TFTs are used. FIG. 10 is a cross-sectional view corresponding to the process step shown in FIG. 4C. In FIG. 10, a gate electrode 1003 is formed on a glass substrate 1001 and extends from a gate line. Also shown are a gate insulator film 1002, a source region 1004, a drain region 1006, a channel region 1005, and an interlayer dielectric film 1007. Contact openings 1008 and 1009 are formed in the interlayer dielectric film 1007. A source line 1010 makes contact with the source region 1004 inside the opening 1008. An electrode 1011 makes contact with the drain region 1006 within the opening 1009. In the configuration of the present embodiment, unwanted pattern portions excluding the contact portions can be removed, in the same way as in the configuration shown in the top plan view of FIG. 2.

EMBODIMENT 3

Figure 11A:
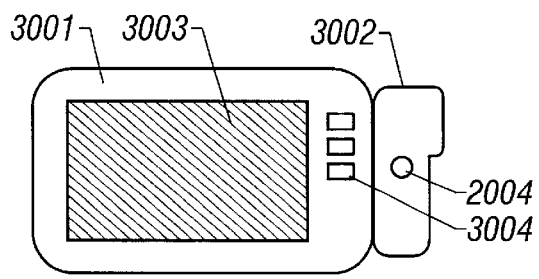
FIGS. 11A–11E are views illustrating applications of an active matrix liquid crystal display in accordance with the invention.

The present invention can be applied to an active matrix liquid crystal display integrated with a peripheral drive circuit. The active matrix liquid crystal display can find use in the following applications. Shown in FIG. 11A is an appliance known as a digital still camera, electronic camera, or video movie capable of treating moving pictures. This appliance has a camera portion 3002 in which a CCD camera or other appropriate image pickup means is disposed. An image taken by the CCD camera is electronically stored in the appliance. The body of this appliance, indicated by 3001, is equipped with a display device 3003. The image taken is displayed on the display device 3003. The appliance can be operated by manually operating control buttons 3004.

Where the present invention disclosed herein is exploited, a liquid crystal display having a high aperture ratio can be built. Therefore, high brightness can be obtained. Also, for a given level of brightness, the electric power consumption can be reduced. Therefore, the invention is useful for a portable appliance or apparatus as shown in FIG. 11A.

Figure 11B:
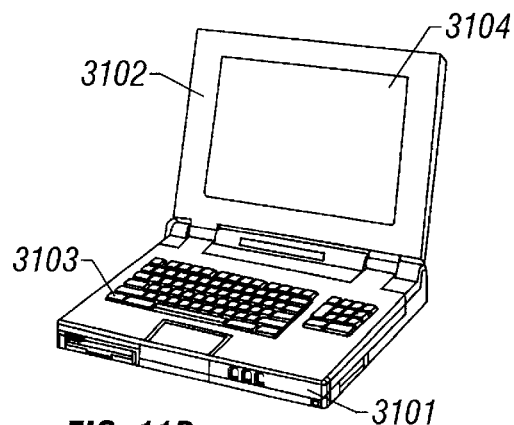

Referring to FIG. 11B, there is shown a portable personal computer whose body is indicated by numeral 3101. A cover 3102 that can be opened is attached to the body 3101. This cover 3102 is equipped with a display device 3104. Various kinds of information can be entered and various arithmetic operations can be performed, using a keyboard 3103.

Figure 11C:
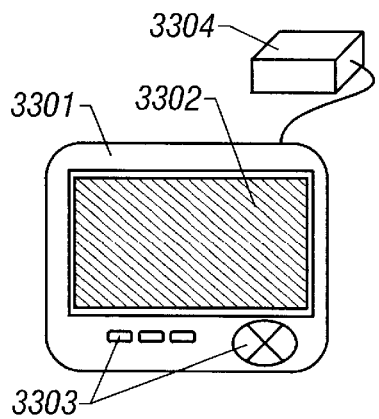

Referring to FIG. 11C, there is shown a car navigational system using a flat-panel display. The body of this navigational system is indicated by 3301. The navigation system comprises the body 3301 having a display device 3302 along with an antenna 3304. Various kinds of information necessary for navigation are switched by operating control buttons 3303. Generally, the navigational system is operated from a remote controller (not shown).

The car navigational system may be exposed to the direct rays of the sun in use. Accordingly, it is useful to adopt the liquid crystal display that is constructed as shown in FIG. 2 and has a high aperture ratio and high brightness.

Figure 11D:
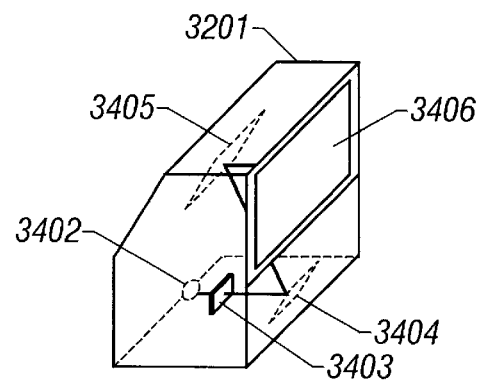

Referring next to FIG. 11D, there is shown a projection liquid crystal display whose body is indicated by numeral 3201. Light emitted from a light source 3402 is optically modulated by a liquid crystal display 3403, producing an image. This image is then reflected by mirrors 3404 and 3405 onto a screen 3406, producing a visible image.

Figure 11E:
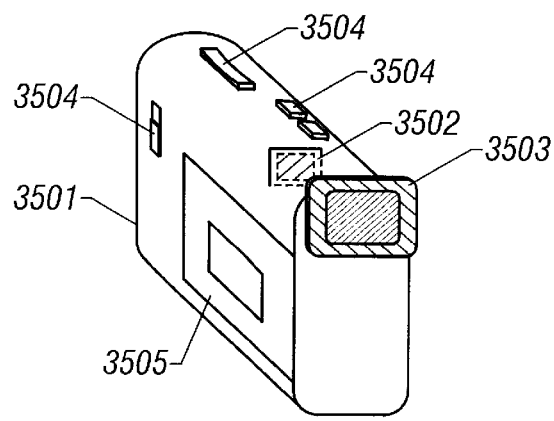

Referring to FIG. 11E, there is shown a video camera whose body is indicated by 3501. This body 3501 is equipped with a display device, known as a viewfinder. This viewfinder consists principally of a liquid crystal display 3502 and an eyepiece 3053 on which an image is projected. The video camera shown in FIG. 11E is controlled by operating control buttons 3504. An image is recorded on magnetic tape received in a tape holder 3505. An image taken by a camera (not shown) is presented on a display device 3502. The image recorded on the magnetic tape is also displayed on the display device 3502. It is necessary to take account of the possibility that the video camera shown in FIG. 11E is used outdoors. Accordingly, it is important to use a liquid crystal display built in accordance with the invention and having an extremely high aperture ratio and high brightness.

EMBODIMENT 4

The present invention can be applied, for example, to an active matrix liquid crystal where a peripheral drive circuit, various kinds of memories, and various arithmetic units are integrated with an active matrix circuit on the same glass substrate. Where various integrated circuits are constructed, using TFTs, it is necessary that the spacing between the TFTs be minimized so that as many as TFTs are packed in a given area.

Figure 14A:
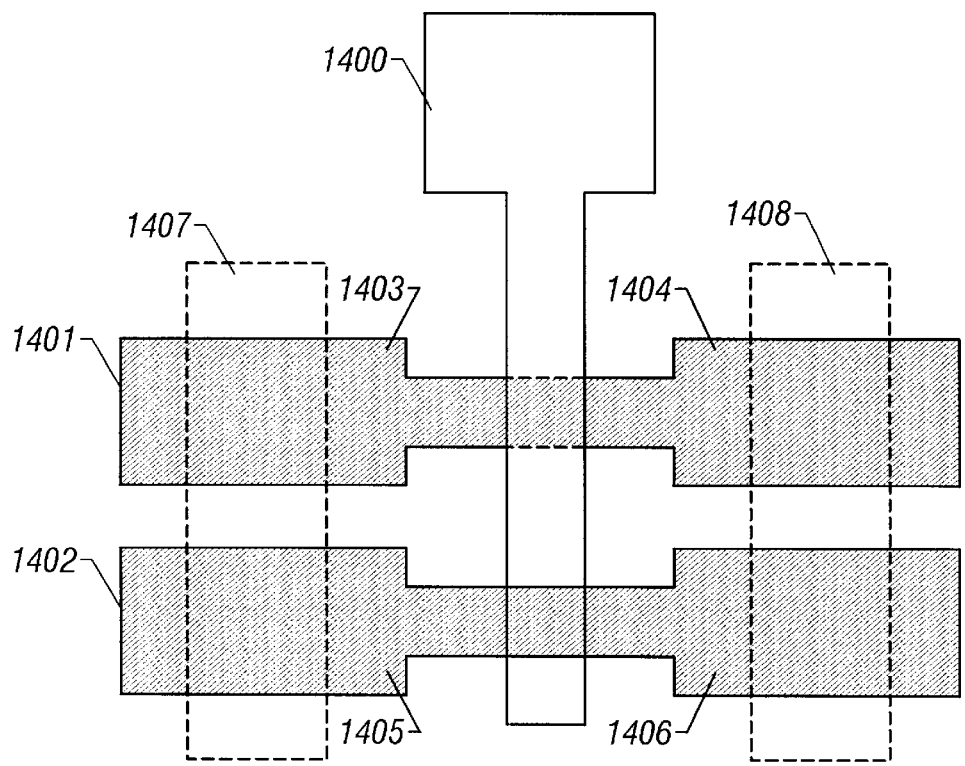
FIGS. 14A and 14B are top views of integrated TFTs.
Figure 14B:
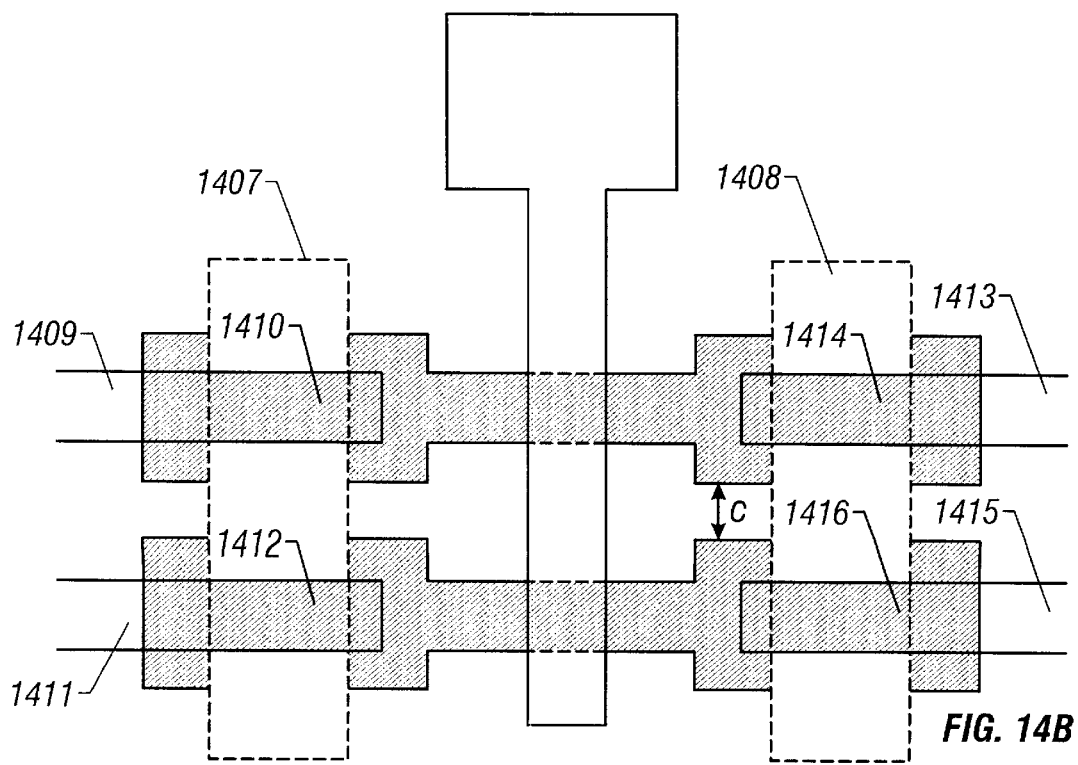

FIGS. 14A and 14B show circuits of two TFTs integrated according to the present embodiment. The two TFTs share one gate electrode. In FIG. 14A, the TFTs have active layers 1401 and 1402 that are made of a crystalline silicon film. A gate electrode pattern 1400 is formed on a gate insulator film (not shown) that covers the active layers. The active layers 1401 and 1402 have openings 1407 and 1408 respectively. The openings are formed at the source region and drain region of the active layers. The active layer 1401 includes a source region 1403 and a drain region 1404. The other active layer 1402 includes a source region 1405 and drain region 1406 similarly. The source regions 1403, 1405 and the drain regions 1404, 1406 are exposed inside the openings 1407 and 1408, respectively. The openings 1407 and 1408 are not required to have very high alignment accuracy. For example, the opening 1407 can be located in any position within the range in which the source region 1403 in the active layer 1401 and the source region 1405 in the active layer 1402 are exposed.

FIG. 14B illustrates a process step following the state shown in FIG. 14A. In FIG. 14B, source electrodes (source interconnects) 1409, 1411 and drain electrodes (drain interconnects) 1413, 1415 are formed in addition to the components shown in FIG. 14A. Under the condition of FIG. 14B, the electrode 1409 makes contact with the source region 1403 inside the opening 1407. The source region 1403 is patterned into the same geometry as the electrode 1409 inside the opening 1407. The electrodes make contact with the doped semiconductor regions (source/drain regions) at 1410, 1412, 1414, and 1416. The merits of the construction of the present embodiment are next described while taking as an example the electrode 1409 making contact with the source region 1403.

The electrode 1409 can be placed in any position within the range in which the patterned source region 1403 and electrode 1409 overlap each other. In other words, the dimensions of the source region 1403 and the electrode 1410 in the active layer are determined according to the alignment accuracy. In the structure shown in FIG. 14B, the source region 1403 is patterned into the same geometry as the electrode 1409 inside the opening 1407. That is, those portions of the semiconductor layer pattern which are not necessary for contacts are removed. Furthermore, the labor required for alignment is reduced compared with the prior art configuration shown in FIGS. 12A and 12B.

The configuration of the present embodiment has the active layer 1401 and the electrode 1409. The formation of the active layer 1401 needs a patterning step. Also, the formation of the electrode 1409 involves a patterning step. In this case, the active layer 1401 and the electrode 1409 need to be positioned relative to each other. Importantly, high alignment accuracy is not required in forming the opening 1407.

Figure 12A:
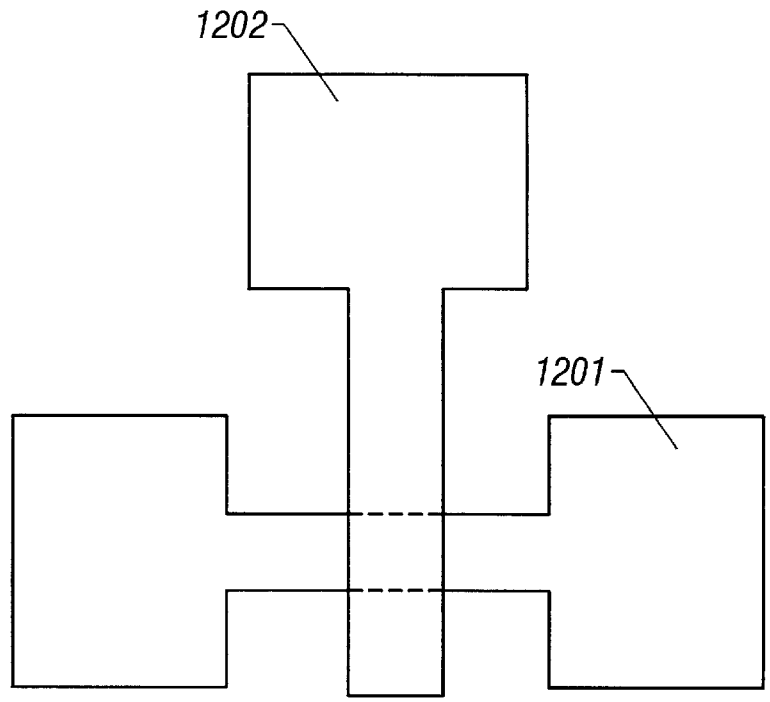
FIGS. 12A and 12B are top views of a conventional TFT.
Figure 12B:
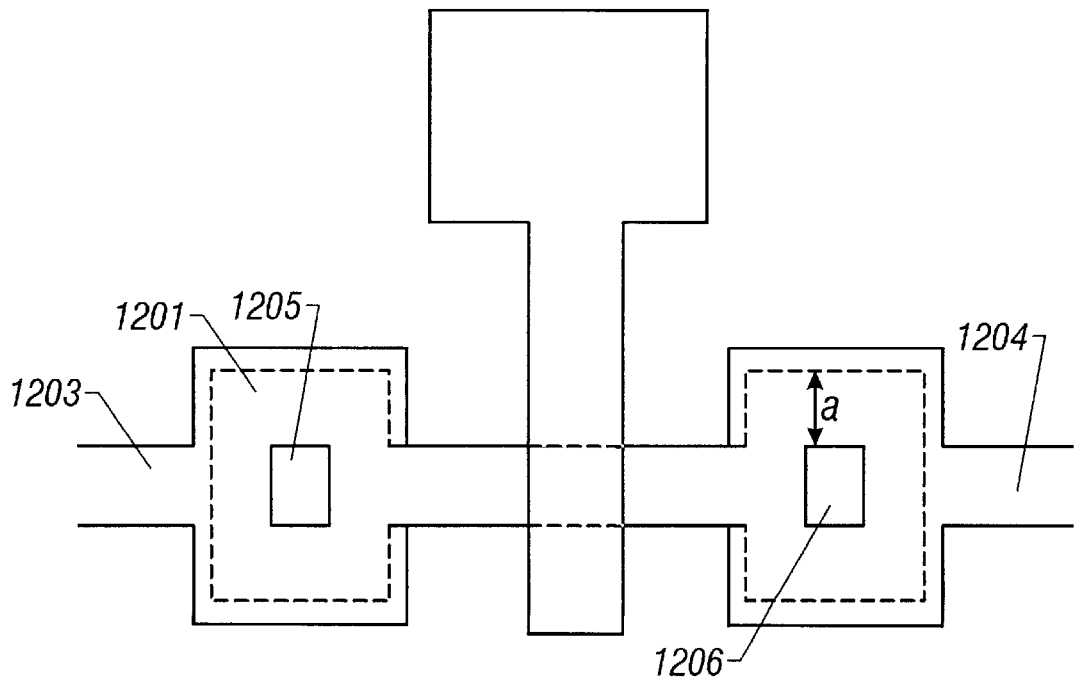
Figure 13:
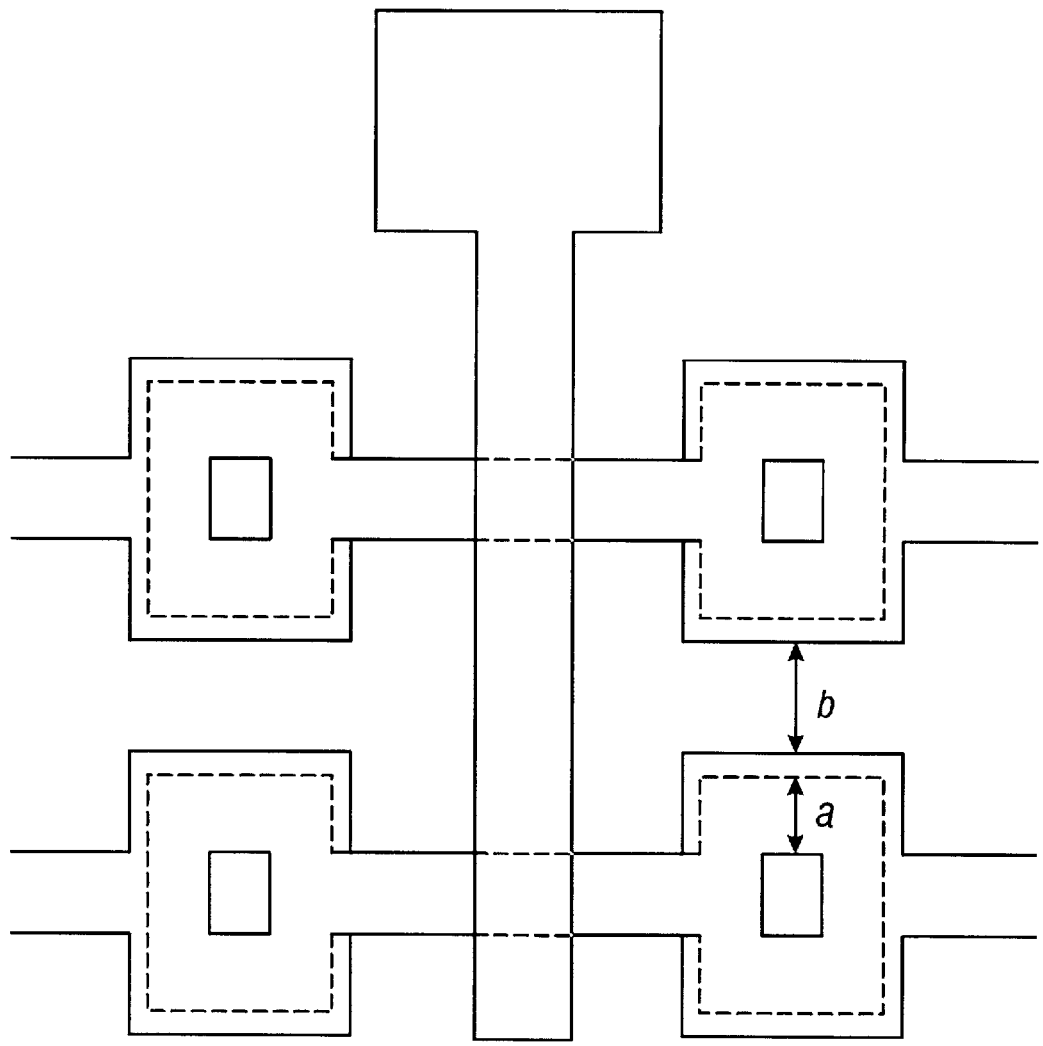
FIG. 13 is a top view of the prior art integrated TFTs.

On the other hand, the prior art method illustrated in FIGS. 12A and 12B needs three patterning steps: (1) patterning of the active layer 1201; (2) patterning to form the contact holes 1205 and 1206; and (3) patterning to form the electrodes 1203 and 1204. Accordingly, it is necessary to position the contact holes 1205 and 1206 relative to the active layer 1201. Also, the electrodes 1203 and 1204 need to be placed relative to the contact holes. This means that doubled burden is imposed on the alignment in comparison with the structure shown in FIGS. 14A and 14B.

Where the two TFTs are integrated, using the structure shown in FIGS. 12A and 12B, the device density is given as shown in FIG. 13, where a is a margin necessary to obtain a contact and b is a dimension necessary to maintain a spacing between adjacent devices. Where the structure of the present embodiment is adopted, a device density as given in FIG. 14B can be obtained with the same design rules as those shown in FIG. 13. Since the burden imposed on the alignment can be halved, the dimension c can be made smaller than the dimension b shown in FIG. 13. More importantly, it is not necessary to set large the area of a contacted electrode as indicated by 1409, which would normally be required to be large to provide contact margin. In addition, the contact area can be made large.

EMBODIMENT 5

Figure 15A:
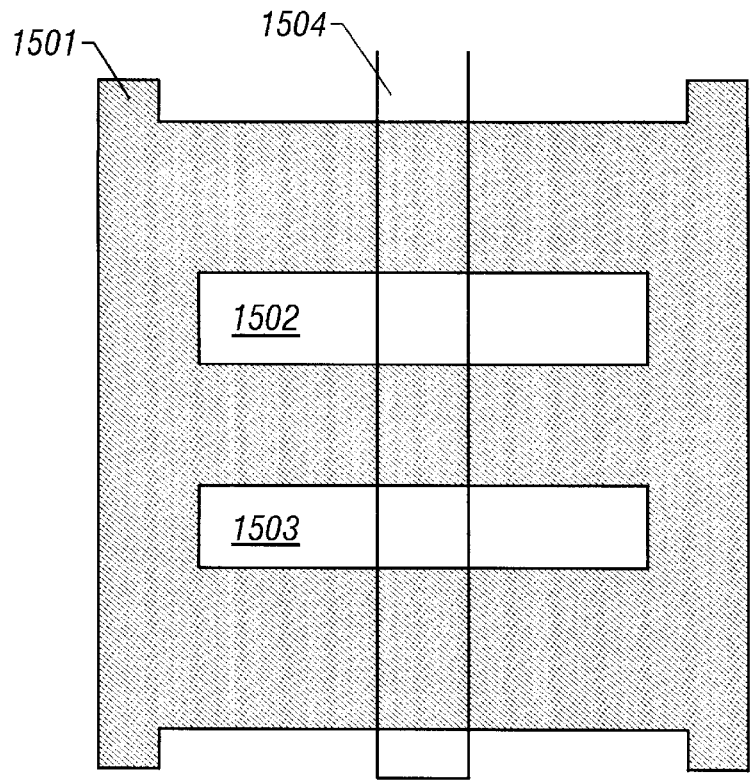
FIGS. 15A and 15B are top views illustrating process steps for fabricating integrated TFTs.
Figure 15B:
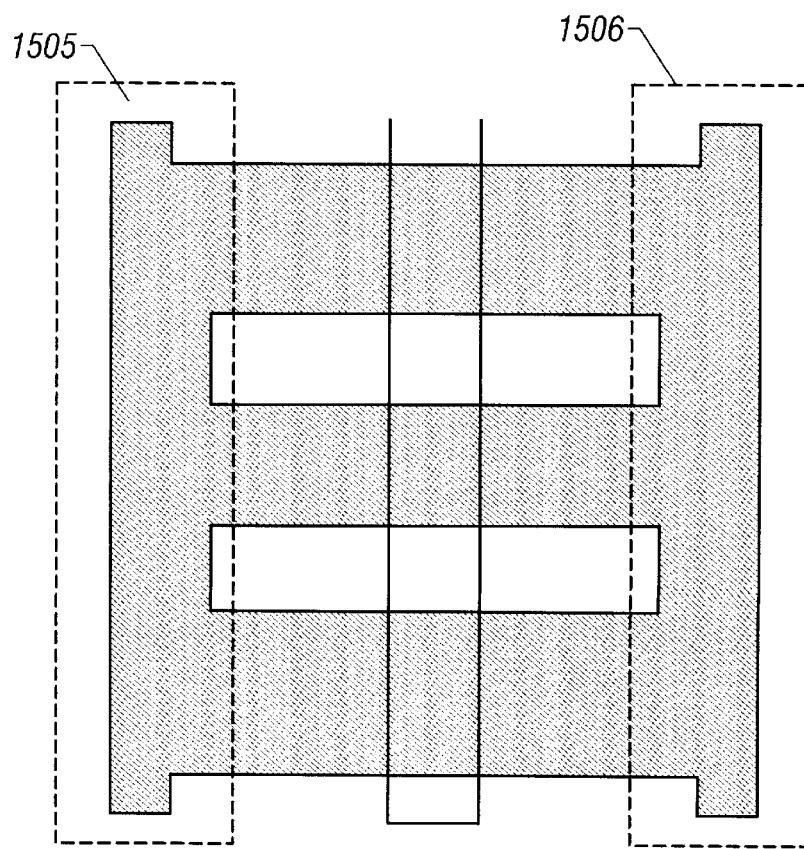
Figure 16:
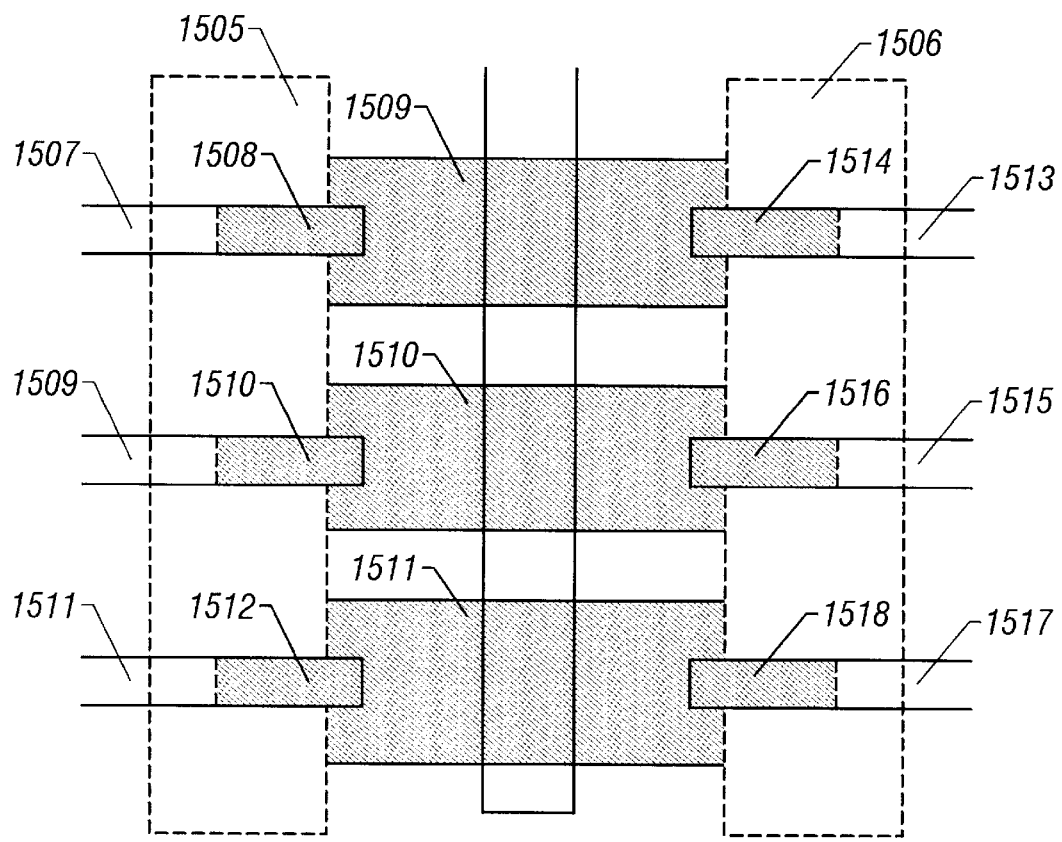
FIG. 16 is a top view of integrated TFTs.

The present embodiment is a modification of the structure of Embodiment 4. FIGS. 15A, 15B, and 16 are top plan views illustrating process steps of the present embodiment. Three TFTs are arranged and integrated.

First, as shown in FIG. 15A, a semiconductor TFT pattern 1501 is formed to provide a basis for the active layer of the TFTs. The active layer of the three TFTs will be formed from this pattern 1501. Trenches 1502 and 1503 will isolate the TFTs from each other later.

A gate insulator film (not shown) is formed over the pattern 1501. A gate electrode 1504 is formed on this gate insulator film. Then, an interlayer dielectric film (not shown) is formed, followed by creation of contact openings 1505 and 1506. This state is shown in FIG. 15B. The semiconductor TFT pattern 1501 is partially exposed within these openings.

After obtaining the state shown in FIG. 15B, dopant ions are implanted, using the gate electrode 1504 as a mask, to impart one conductivity type to the regions excluding the regions capped with the gate electrode 1504. Electrodes and conductive interconnects for making contact with the source/drain regions are formed on the interlayer dielectric film (not shown).

In FIG. 16, source electrodes 1507, 1509, and 1511 make contact with source regions. Drain electrodes 1513, 1515, and 1517 make contact with drain regions. Electrodes 1508, 1510, 1512, 1514, 1516, and 1518 make contact with semiconductor source/drain regions.

The active layer 1501 shown in FIG. 15(A) is patterned into the same geometry as the geometry of the electrodes such as 1507 inside the openings 1505 and 1506 when the electrodes such as 1507 are formed by a patterning operation. At this time, individual devices are isolated. Specifically, the active layer is isolated into the electrodes 1509, 1510, and 1511 when the electrodes making contact with the source and drain regions are formed by a patterning operation. The present embodiment is characterized in that the active layer is isolated into individual devices when the contact electrodes are formed. Hence, the individual devices can be more closely spaced from each other. Simultaneously, the contact area can be increased. This is enabled by setting the area of the contact opening larger than the contact area and patterning the doped regions within the openings by making use of the contacted electrode pattern. As a result, the accuracy at which the contact openings are aligned presents no problems. Only the alignment of the active layer with the contact electrodes is a concern. Consequently, the device density can be enhanced further even if conventional design rules are used.

EMBODIMENT 6

Figure 17:
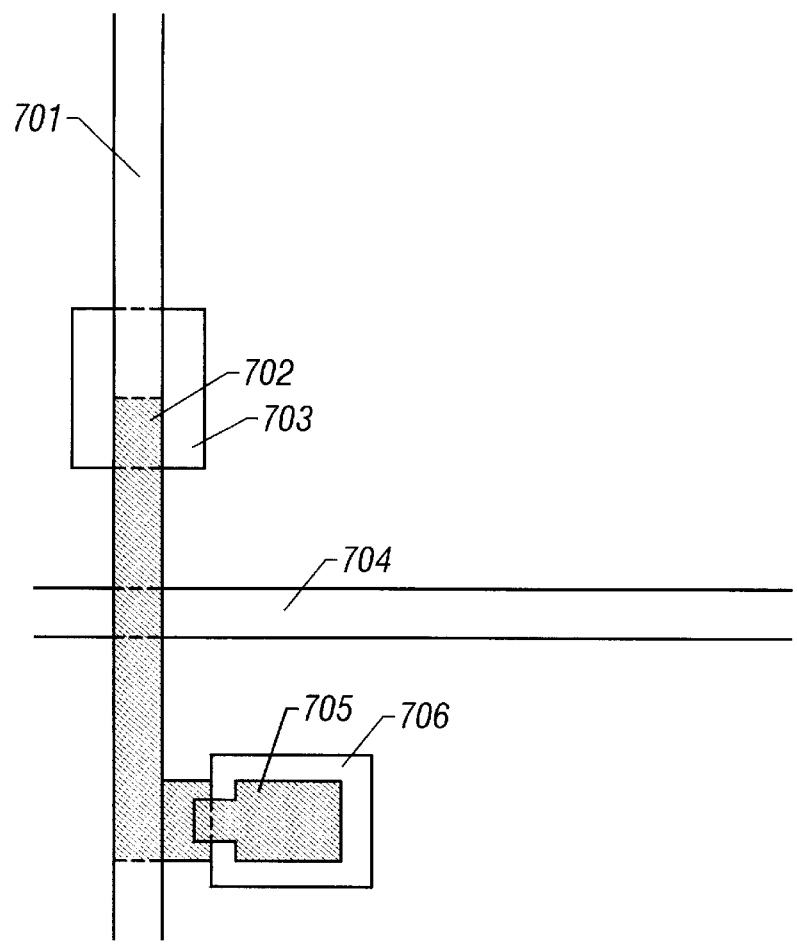
FIG. 17 is a top view of one pixel.

The present embodiment relates to an active matrix circuit whose aperture ratio is made as high as possible. The structure of the present embodiment is summarized in FIG. 17, where there are shown a source line 701 and a gate line 704. Indicated by hatching is an active layer that mostly overlaps the source line 701. In the active layer, the source region and source line make contact with each other through a region 702 inside the opening 703. Inside the opening 703, the active layer is patterned into the source line 701.

An electrode 705 makes contact with the drain region inside an opening 706. Within the opening 706, the drain region is patterned into the same geometry as the geometry of the electrode 705.

Also in the structure of the present embodiment, any electrode area excluding areas necessary for contacts is not needed while securing sufficient margin for alignment for contacts. At the same time, the contact area can be made large. These advantages can be obtained by patterning the contacted semiconductor within the contact opening, utilizing the geometry of the contacted electrode pattern.

EMBODIMENT 7

Figure 18A:
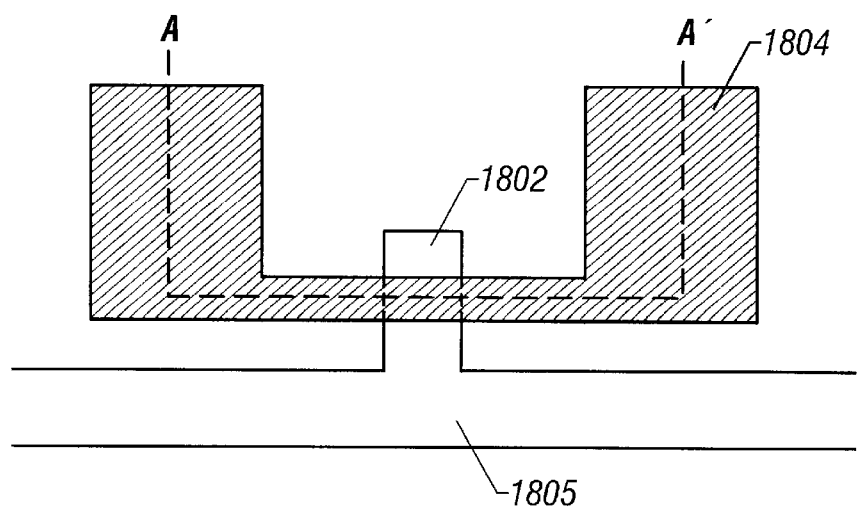
FIGS. 18A and 18B are views illustrating process steps for fabricating a TFT disposed at a pixel.
Figure 18B:
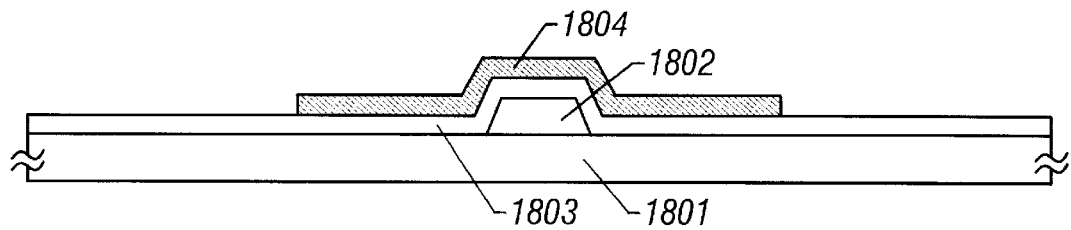

In the present embodiment, the structure of pixels of an active matrix liquid crystal display is shown. Here, bottom-gate TFTs made of an amorphous silicon film are used. A process sequence for the present embodiment is schematically shown in FIGS. 18A and 18B and the following figures. FIG. 18A is a top plan view of one pixel of the active matrix liquid crystal display around which a source line and a gate line intersect with each other. FIG. 18B is a cross-sectional view taken on line A–A' of FIG. 18A.

First, an aluminum film (not shown) is formed to a thickness of 3000 Å on a glass substrate 1801 by sputtering techniques. This aluminum film is then patterned to form a gate electrode 1802 extending from a gate line 1805, as shown in FIG. 18A. The substrate may be fabricated from any material as long as it has an insulating surface. It is necessary, however, to take account of the process temperature, the conditions under which the substrate is used, and other factors.

Then, an anodic oxide film (not shown) having a thickness of 200 Å is deposited on the patterned aluminum film. This anodic oxide film electrically and physically protects the surface of the aluminum film pattern and suppresses formation of needle-like protrusions known as hillocks and whiskers which would normally be caused by overgrowth of aluminum during process steps performed later. This anodic oxide film also serves to enhance the adhesion of a resist mask formed on the aluminum film later. Instead of the anodic oxide film, a film of a metal such as titanium or chromium may be formed to an extremely small thickness of approximately 100 to 300 Å to suppress generation of hillocks.

After forming the gate electrode 1802 and the gate line 1805, a silicon oxide film 1803 that will act as a gate insulator film is deposited to a thickness of 1000 Å by plasma CVD. Subsequently, an amorphous silicon film that will serve as the active layer of TFT is formed to a thickness of 500 Å by LPCVD. In this example, disilane is used as a gaseous material, and plasma CVD is utilized.

Figure 19A:
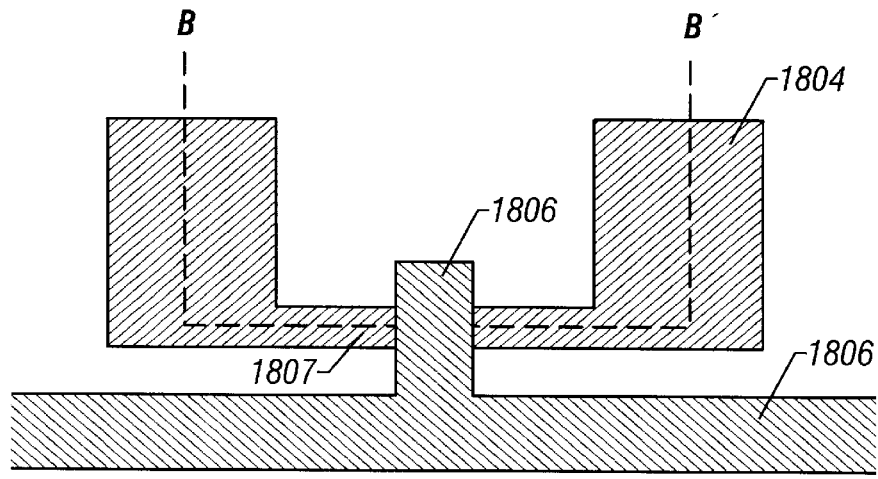
FIGS. 19A and 19B are views illustrating process steps for fabricating a TFT disposed at a pixel.
Figure 19B:
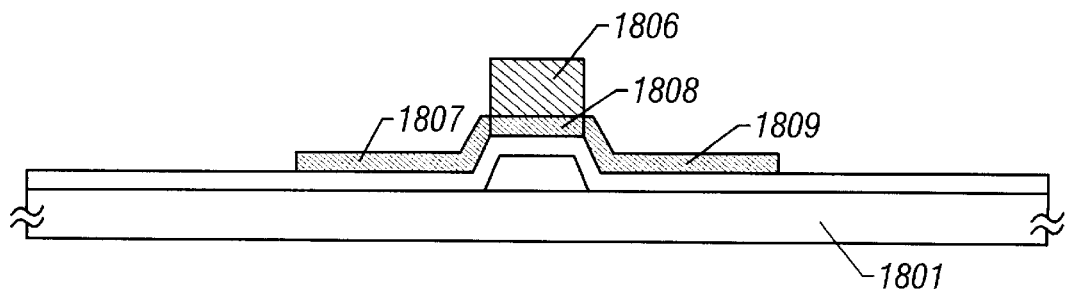

Thereafter, the amorphous silicon film is patterned to form an active layer pattern 1804, resulting in a state as shown in FIGS. 18A and 18B. Light is shone from the side of the glass substrate 1801, forming a resist mask 1806, as shown in FIGS. 19A and 19B. As can be seen from FIG. 19A, the resist pattern 1806 is formed on the source electrode and on a conductive interconnect extending from the source electrode. FIG. 19B is a cross-sectional view taken on line B–B' of FIG. 19A.

After creating the resist mask 1806, phosphorus (P) is implanted as dopants for imparting N-type conductivity by plasma doping. As a result of this process step, phosphorus is introduced into regions 1807 and 1809, which become doped regions. A region 1808 becomes a channel region. Then, laser light is directed to the top surface of the substrate to activate the doped regions.

Figure 20A:
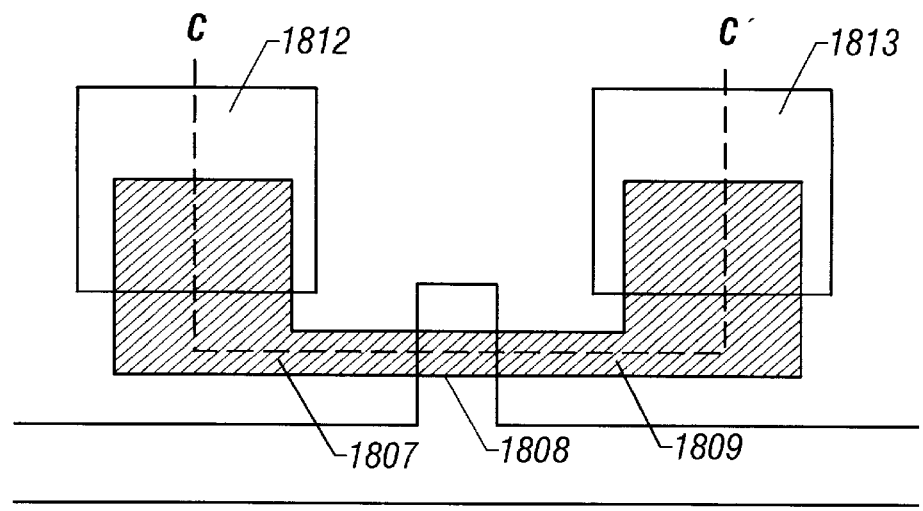
FIGS. 20A and 20B are views illustrating process steps for fabricating a TFT disposed at a pixel.
Figure 20B:
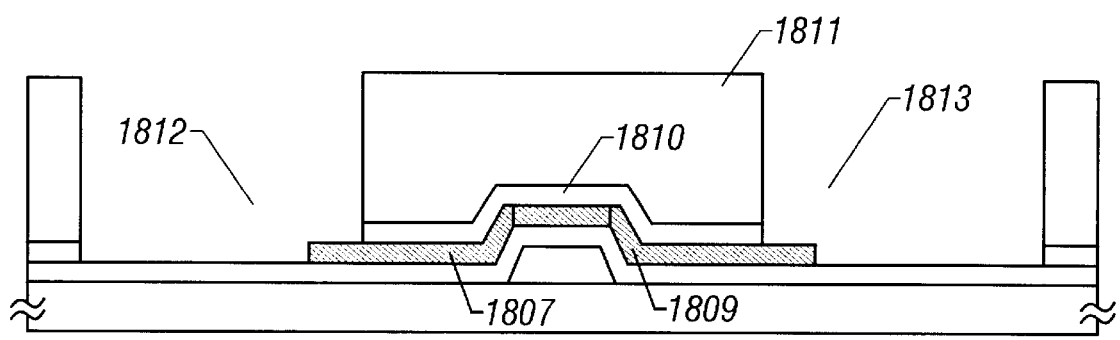

Subsequently, the resist mask 1806 is removed, followed by formation of a silicon nitride film 1810 having a thickness of 2000 Å by plasma CVD, as shown in FIG. 20B. This silicon nitride film 1810 will form a first interlayer dielectric film. A polyimide resin film 1811 that is also used to form the first interlayer dielectric film is spin coated. Besides the polyimide resin described above, polyamide, polyimidamide, and other resinous materials may be employed. In this way, the interlayer dielectric film consisting of the silicon nitride film 1810 and the polyimide film 1811 is formed.

Then, openings 1812 and 1813 are formed, as shown in FIGS. 20A and 20B, to allow to make contact with parts of the source region 1807 and drain region 1809 exposed inside the openings. After the openings have been created, the source region 1807 and the drain region 1809 are exposed at the bottoms of the openings. In this manner, a state shown in FIGS. 20A and 20B is obtained. FIG. 20B is a cross-sectional view taken on line C–C' of FIG. 20A.

Figure 21A:
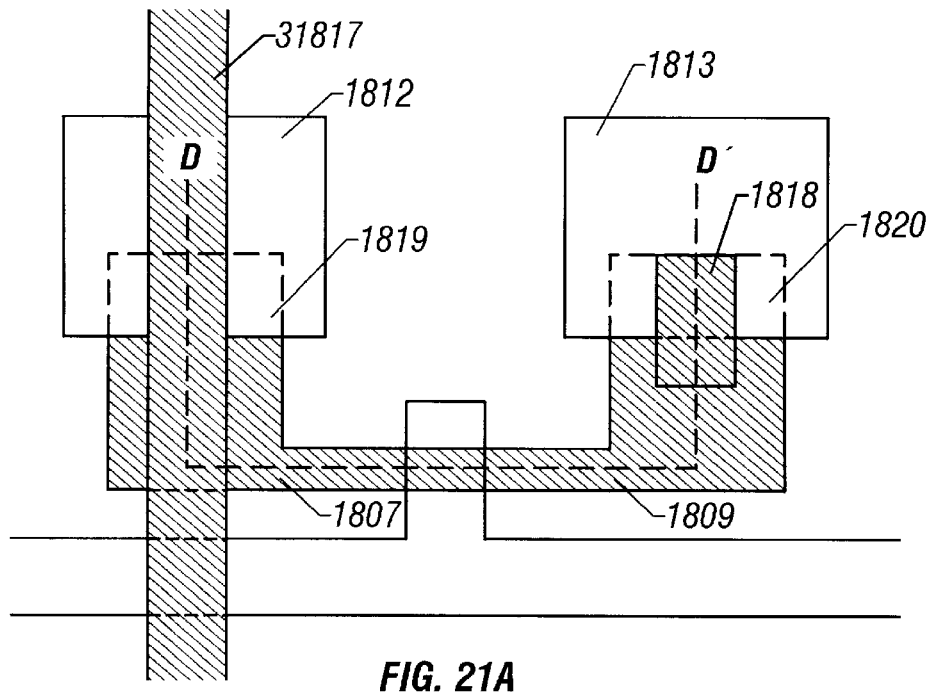
FIGS. 21A–21C are views illustrating process steps for fabricating a TFT disposed at a pixel.
Figure 21B:
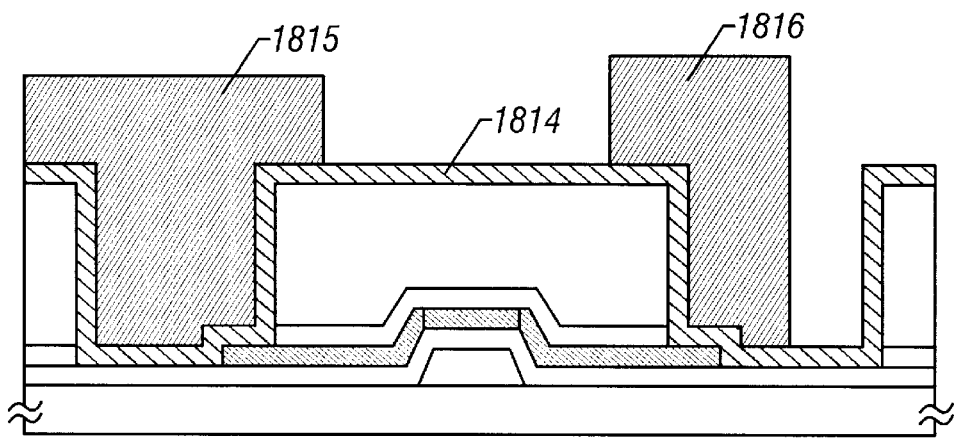
Figure 21C:
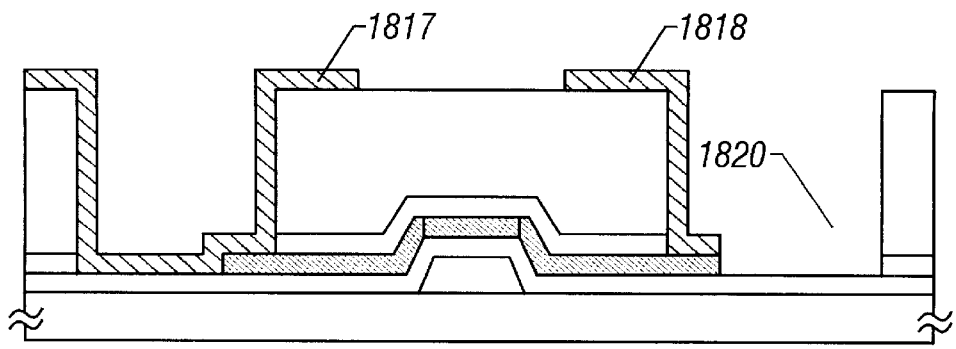

Subsequently, a titanium film having a thickness of 500 Å, an aluminum film having a thickness of 2000 Å, and a titanium film having a thickness of 500 Å are sputter-deposited to build up a metallic laminate film 1814 as shown in FIG. 21B. Resist masks 1815 and 1816 are placed, resulting in a state shown in FIG. 20B. Using these resist masks, the metallic laminate film 1814 is patterned, followed by etching of the underlying semiconductor layer (active layer). This etching is carried out by dry etching (RIE), using a mixture of SiCl$_4$, Cl$_2$, and BCl$_3$ as an etchant gas. Where this etchant gas is used, etching of the silicon film is carried out subsequently to the etching of the metallic laminate film 1814. In this way, a state shown in FIGS. 21A and 21C is derived. FIG. 21C is a cross-sectional view taken on line D–D' of FIG. 21A.

As can be seen from FIG. 21C, the electrode pattern 1817 created by the metallic laminate film 1814 patterns the active layer (source region 1807) exposed inside the opening 1812 in a self-aligned manner. That is, inside the opening 1812, the source region 1807 is patterned into the same geometry as the geometry of the electrode pattern 1817. As a result, a part 1819 of the source region 1807 not contributing to contacts is removed. Indicated by 1817 is a source line pattern.

Similarly, the electrode pattern 1818 (drain electrode) acts to pattern the drain region 1809 in a self-aligned manner within the opening 1813. Consequently, a part 1820 of the drain region not contributing to contacts is removed.

Figure 22A:
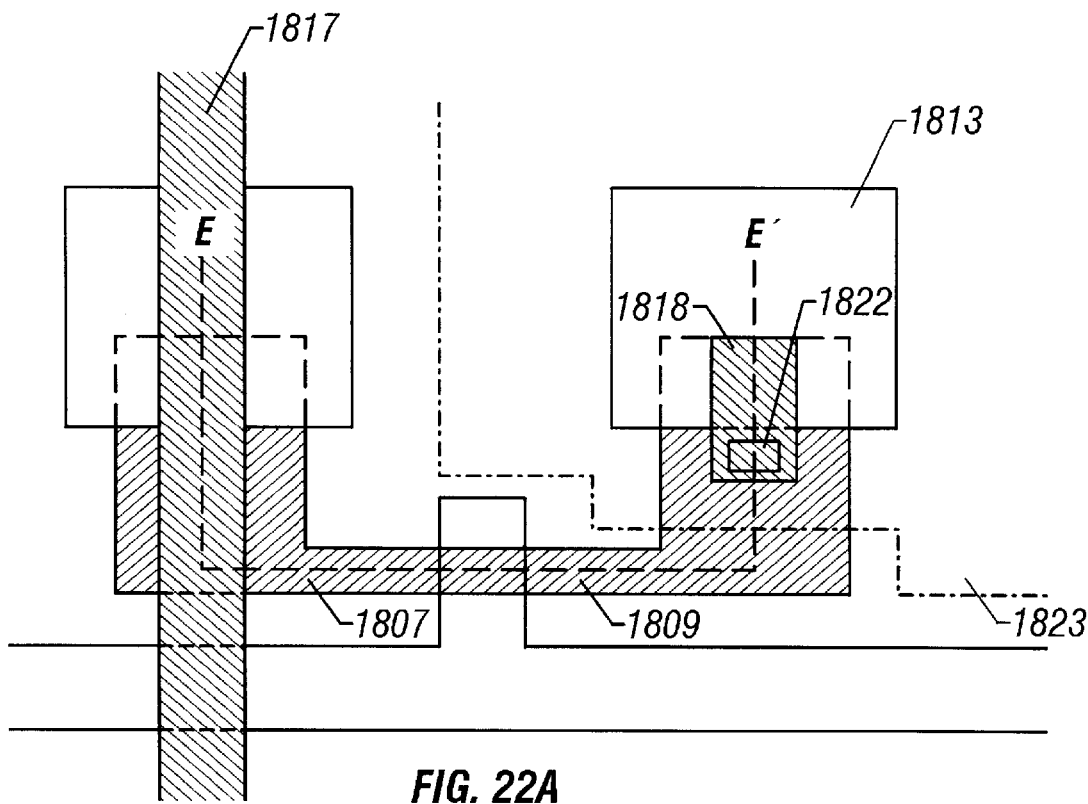
FIGS. 22A and 22B are views illustrating process steps for fabricating a TFT disposed at a pixel.
Figure 22B:
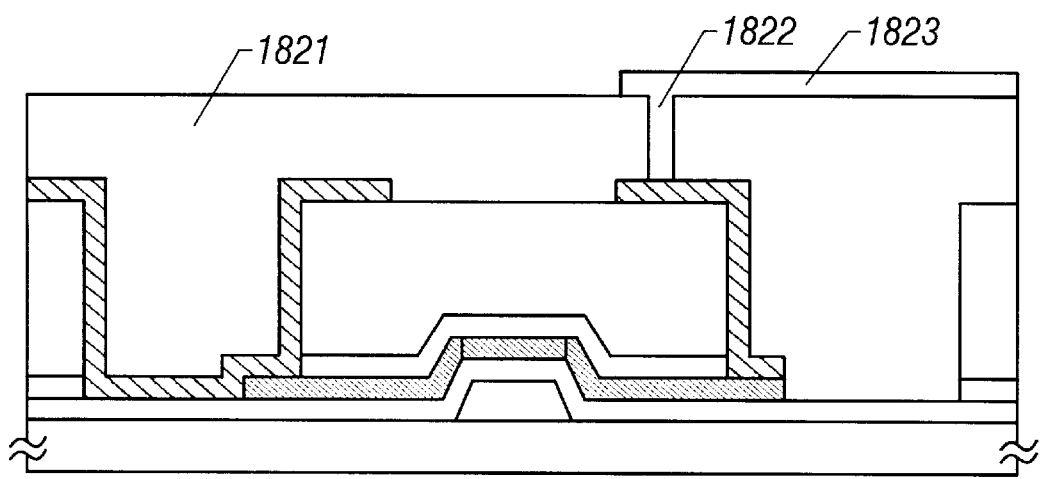

Importantly, even if the metallic laminate film pattern, 1817 and 1818, is slightly out of position, the source line 1817 and the drain electrode 1818 make contact with the source region 1807 and the drain region 1809, respectively, with the same contact area. Furthermore, if the film pattern, 1817 and 1818, is slightly out of position, active regions 1819 and 1820 not required for contacts are removed and so the aperture ratio is not increased so much. That is, if the film pattern, 1817 and 1818, is slightly misplaced, the effective area contributing to contacts and the aperture ratio can be prevented from changing. In this way, a state shown in FIGS. 21A and 21C is obtained. Then, a polyimide resin 1821 is formed as a second interlayer dielectric film as shown in FIG. 22B.

Then, a contact hole 1822 is created, and a pixel electrode 1823 of ITO is formed. FIG. 22B is a cross-sectional view taken on line E–E' of FIG. 22A. Thereafter, an orientation film (not shown) is formed. Then, orientation processing is performed. This substrate is bonded to a counter substrate manufactured separately. A liquid crystal material is injected into the gap between these two substrates, thus completing a liquid crystal panel.

Where the configuration of the present embodiment is adopted, sufficient margin for contacts can be secured. Also, any undesired semiconductor layer pattern or undesired electrode pattern can be eliminated. Yet, sufficient contact area can be assured. Moreover, the aperture ratio of the pixels can be enhanced.

EMBODIMENT 8

Figure 23A:
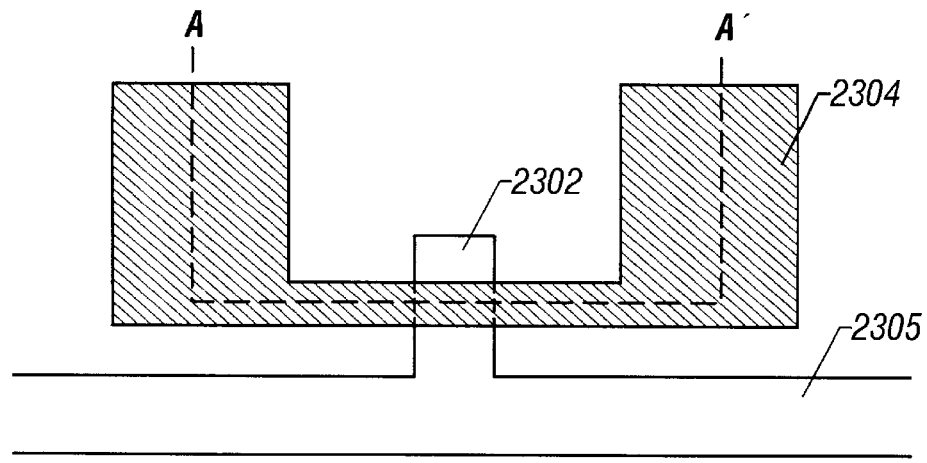
FIGS. 23A and 23B are views illustrating process steps for fabricating a TFT disposed at a pixel.
Figure 23B:
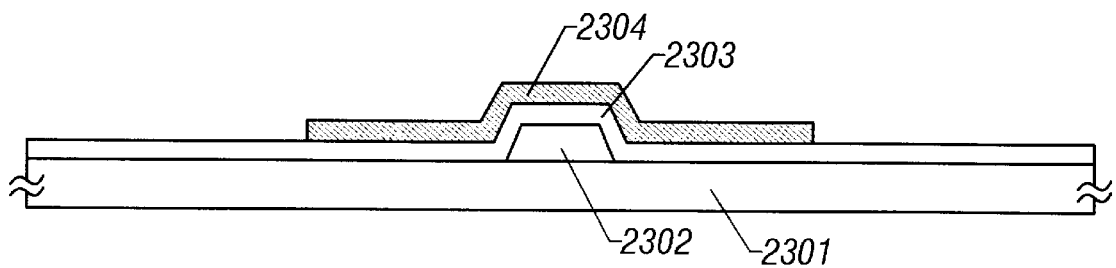

The present embodiment shows an example in which a TFT structure different from the configuration of Embodiment 7 is adopted. A process sequence for the present embodiment is shown in FIG. 23A and the following figures. FIG. 23B is a cross section taken on line A–A' of FIG. 23A.

First, as shown in FIG. 23B, a gate electrode 2302 is formed on a glass substrate 2031. The gate electrode is made of aluminum and formed so as to extend from a gate line 2305. The aluminum film forming the gate electrode is 4000 Å thick.

Then, a silicon oxide film 2303 is deposited as a gate insulator film to a thickness of 1000 Å by plasma CVD. Thereafter, an amorphous silicon film is formed as the active layer of TFT to a thickness of 500 Å by LPCVD. This film is patterned to create the active layer 2304. The channel region of the TFT will be formed in this active layer (FIG. 23B).

Figure 24A:
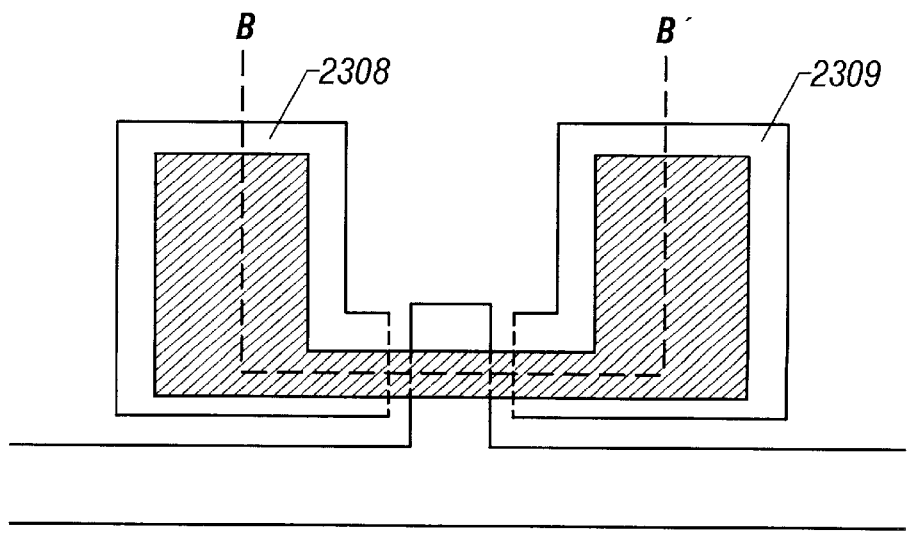
FIGS. 24A–24C are views illustrating process steps for fabricating a TFT disposed at a pixel.
Figure 24B:
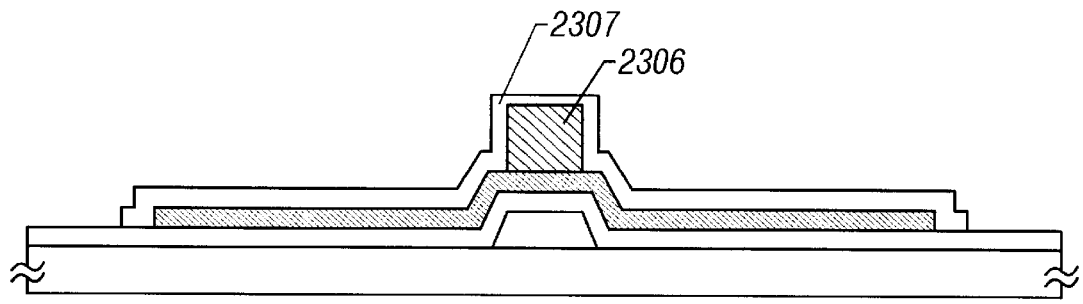

As shown in FIG. 24B, a resist material is then applied to the whole surface. Radiation is shone from the rear side of the substrate, thus producing a resist mask 2306. A phosphorus-doped, N-type amorphous silicon film is formed by plasma CVD or LPCVD. In this example, the N-type amorphous silicon film is deposited by plasma CVD, using a gaseous mixture of silane, hydrogen, and phosphine. This film is then patterned to create an N-type amorphous silicon film pattern 2307. Suppose that the formed TFT is of the N-channel type. If a P-channel type TFT should be manufactured, a P-type amorphous silicon film may be formed instead of the N-type amorphous silicon film 2307.

Figure 24C:
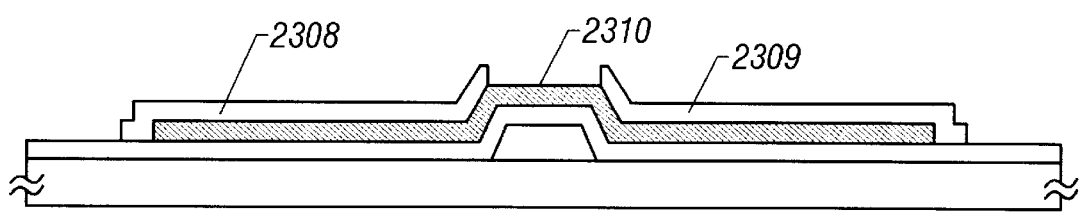

After obtaining the state shown in FIG. 24B, the resist mask 2305 is removed, resulting in a state shown in FIG. 24C, which is a cross section taken on line B–B' of FIG. 24A. In FIGS. 24A and 24C, there are shown a source region 2308, a drain region 2309, and a channel region 2310.

Figure 25A:
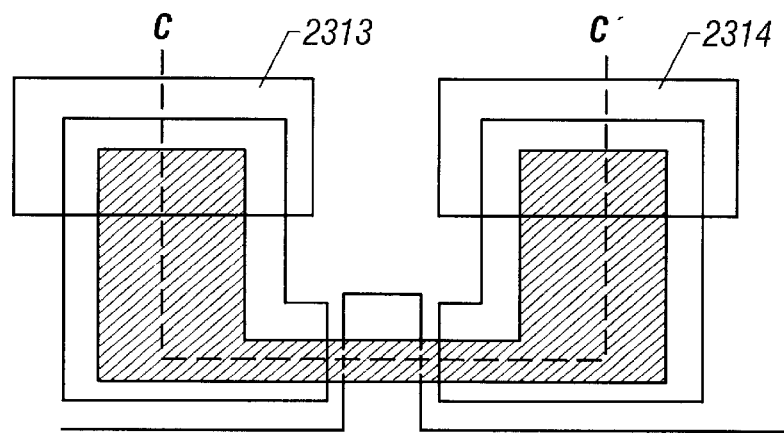
FIGS. 25A and 25B are views illustrating process steps for fabricating a TFT disposed at a pixel.
Figure 25B:
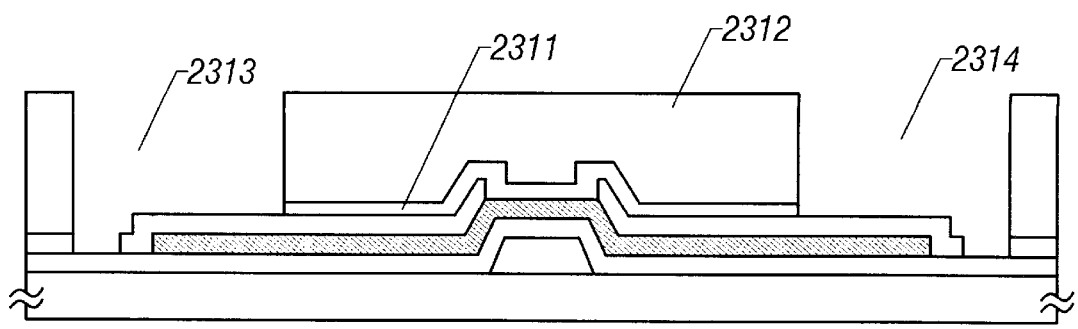

On reaching the state shown in FIGS. 24A and 24C, a silicon nitride film 2311 is formed as a first interlayer dielectric film to a thickness of 500 Å by plasma CVD, as shown in FIG. 25B. Then, a polyimide resin film 2312 is formed. The thinnest portion of this polyimide resin film is 1 μm thick. Contact holes 2313 and 2314 are created by dry etching. FIG. 25B is a cross-sectional view taken on line C–C' of FIG. 25A.

Figure 26A:
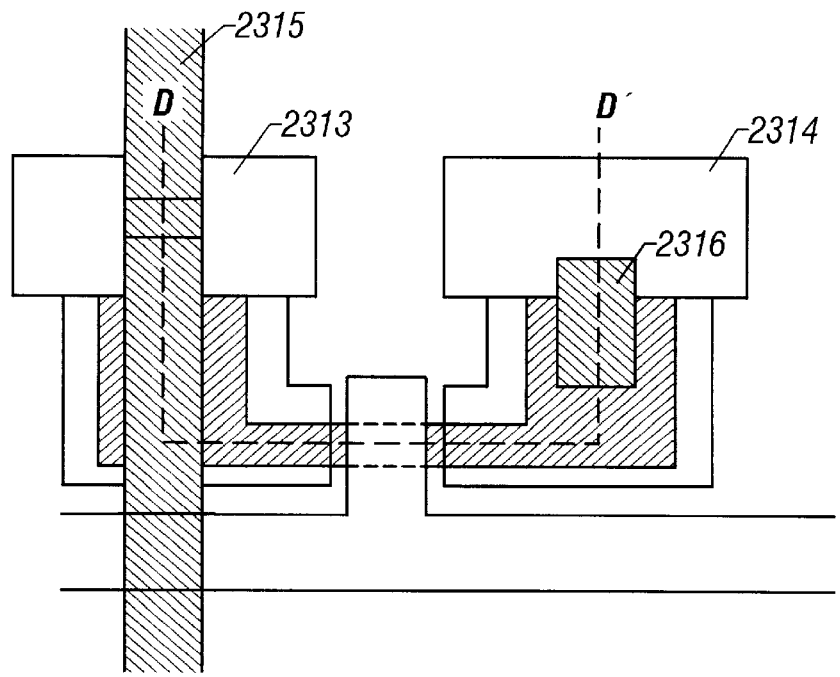
FIGS. 26A and 26B are views illustrating process steps for fabricating a TFT disposed at a pixel.
Figure 26B:
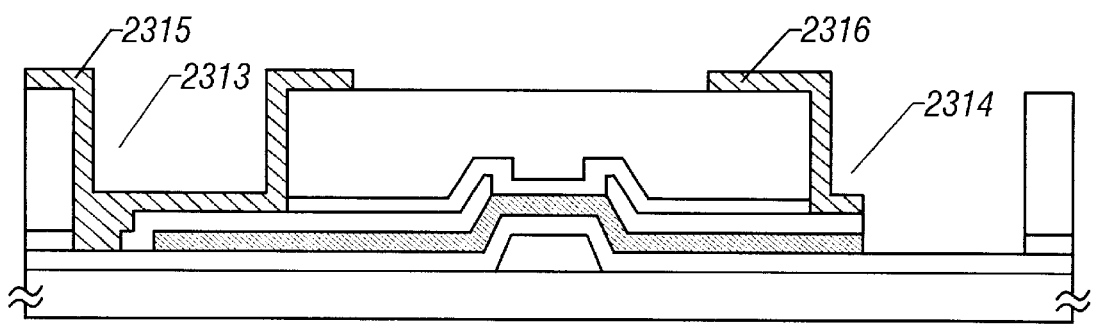

Then, a source line (acting also as a source electrode) 2315 and a drain electrode 2316 are formed by dry etching as shown in FIGS. 26A and 26B. FIG. 26B is a cross-sectional view taken on line D–D' of FIG. 26A. During this process, the semiconductor layer exposed within the openings 2313 and 2314 is patterned, using the pattern of the source line 2315 and drain electrode 2316. In this manner, the semiconductor layer can be patterned by self-aligned technology inside the openings. This structure makes it possible to remove regions other than those required for contacts. Hence, the aperture ratio can be enhanced. Also, sufficient contact margin can be secured.

Figure 27A:
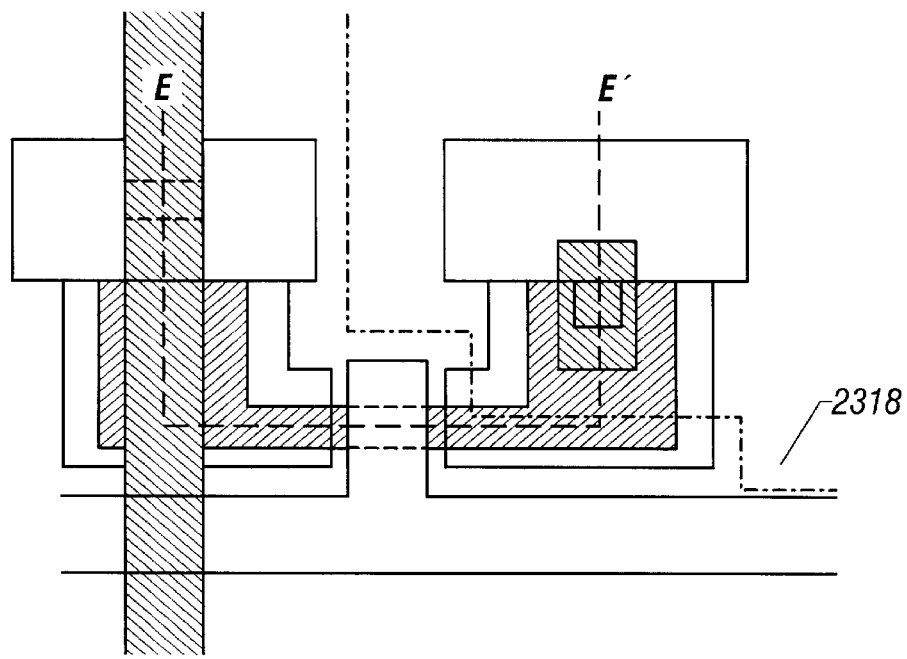
FIGS. 27A and 27B are views illustrating process steps for fabricating a TFT disposed at a pixel.
Figure 27B:
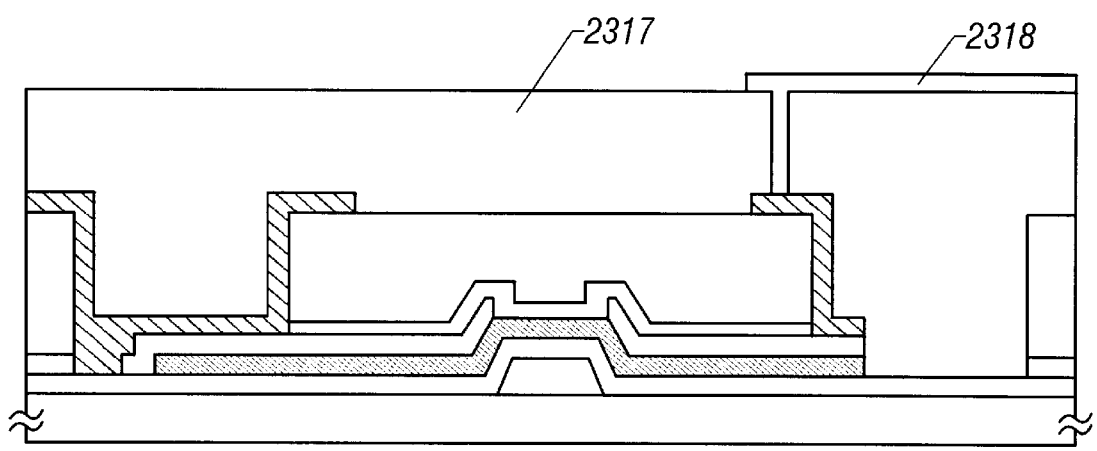

After obtaining the state shown in FIGS. 26A and 26B, a polyimide resin film 2317 is formed as a second interlayer dielectric film as shown in FIG. 27B. The minimum thickness of the polyimide resin film 2317 is set to 5000 Å. FIG. 27B is a cross-sectional view taken on line E–E' of FIG. 27A. Then, a contact hole is created. A pixel electrode 2318 is fabricated from ITO. Thus, a TFT disposed at one pixel of an active matrix region is completed.

EMBODIMENT 9

The present embodiment is similar to Embodiment 7 except that source/drain regions are irradiated with laser light to crystallize them. A process sequence for the present embodiment is illustrated in FIGS. 19A and 19B. Dopant ions are implanted, using a resist mask 1806, to impart one conductivity type. Then, the laser light is directed to fall on the rear side of a substrate 1801. In this way, the doped regions can be activated and crystallized.

EMBODIMENT 10

The present embodiment is similar to Embodiment 7 except that the resist mask 1806 used for the process step of FIGS. 19A and 19B is made of other material. Where a resist mask is used for plasma implantation steps or ion implantation steps, the resist mask will cure. The cured mask must be removed by ashing. To avoid this problem, the mask 1806 is formed from a silicon oxide film. For this purpose, the resist mask is formed on the silicon oxide film by exposure from the rear side of the substrate, the silicon oxide film being formed over the whole surface of the substrate. The silicon oxide film is patterned, using this resist mask. The resist mask is then removed to place an implant mask of a silicon oxide film at a location 1806 in FIGS. 19A and 19B.

EMBODIMENT 11

The present embodiment is similar to Embodiment 7 except that the active layer is made of a crystalline silicon film. In the state shown in FIG. 18B, laser light is projected from the side of the top surface of the substrate. This crystallizes the active layer 1804 consisting of an amorphous silicon film. Thus, an active layer of a crystalline silicon film is obtained.

The present invention can provide a structure whose aperture ratio is maximized by eliminating unwanted electrode pattern portions while securing sufficient alignment margin for formation of contacts. Furthermore, the device density of the drive circuit of an active matrix circuit and the device densities of other integrated circuits can be enhanced. In addition, the packing density of an integrated circuit configuration comprising an active matrix circuit integrated with various other integrated circuits on a common glass substrate can be -enhanced. The invention can be applied to electroluminescent displays, as well as to liquid crystal displays. Moreover, the invention can be applied to flat-panel displays that largely transmit light.

What is claimed is:

1. A semiconductor device comprising:
    a semiconductor layer formed on an insulating surface;
    an interlayer insulating film formed over said semiconductor layer;
    a contact hole formed through said interlayer insulating film to expose a portion of said semiconductor layer therein;
    an electrode formed on said interlayer insulating film and extending into said contact hole to electrically contact said semiconductor layer,
    wherein said semiconductor layer and said electrode are patterned in said contact hole coextensively, and
    wherein an area of said contact hole is larger than an area in which said electrode contacts the semiconductor layer.

2. The semiconductor device of claim 1, wherein said electrode does not overlap at least one edge of said contact hole.

3. The semiconductor device of claim 1, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

4. The semiconductor device of claim 1, further comprising a gate electrode over said semiconductor layer.

5. The semiconductor device of claim 1, further comprising a gate electrode between said insulating surface and said semiconductor layer.

6. A semiconductor device comprising:
    a semiconductor layer formed on an insulating surface;
    an interlayer insulating film formed over said semiconductor layer;
    a contact hole formed through said interlayer insulating film to expose a portion of said semiconductor layer therein;
    an electrode formed on said interlayer insulting film and extending into said contact hole to electrically contact said semiconductor layer,
    wherein said semiconductor layer has at least one edge in said contact hole, said one edge being substantially aligned with an edge of said electrode, and
    wherein an area of said contact hole is larger than an area in which said electrode contacts said semiconductor layer.

7. The semiconductor device of claim 6, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

8. The semiconductor device of claim 6, further comprising a gate electrode over said semiconductor layer.

9. The semiconductor device of claim 6, further comprising a gate electrode between said insulating surface and said semiconductor layer.

10. A semiconductor device comprising:
    a substrate having an insulating surface;
    a semiconductor layer formed on said insulating surface;
    an interlayer insulating film formed over said semiconductor layer;
    a contact hole formed through said interlayer insulating film to expose a portion of said semiconductor layer in said contact hole;
    a wiring extending on said interlayer insulating film in one direction and electrically connected to said semiconductor layer through said contact hole, said wiring crossing over said contact hole, wherein said contact hole has opposed side edges with said wiring intervening therebetween and said wiring does not overlap said side edges, and wherein an area of said contact hole is larger than an area in which said wiring contacts said semiconductor layer.

11. A semiconductor device according to claim 10 wherein said semiconductor layer is patterned in said contact hole coextensively with a part of said wiring.

12. The semiconductor device of claim 10, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

13. The semiconductor device of claim 10, further comprising a gate electrode over said semiconductor layer.

14. The semiconductor device of claim 10, further comprising a gate electrode between said insulating surface and said semiconductor layer.

15. An active matrix device comprising:

a matrix of pixels arranged over a substrate;

a matrix of semiconductor islands arranged over said substrate corresponding to said matrix of pixels, each of said semiconductor islands constituting a thin film transistor for switching associated one of the pixels;

a pair of impurity regions formed in each of said semiconductor islands with a channel region therebetween;

an interlayer insulating film formed over said semiconductor islands, said interlayer insulating film having a plurality of contact holes wherein each of said semiconductor islands has its one of the impurity regions exposed in corresponding one of said contact holes;

a source line extending on said interlayer insulating film along an array of said semiconductor islands, wherein each of said semiconductor islands of said array is electrically connected to said source line at the one of the impurity regions in said contact holes, wherein said one of the impurity regions is patterned in associated one of said contact holes substantially coextensively with a portion of said source line, and wherein an area of each of said plurality of contact holes is larger than an area in which said source line contacts each of said semiconductor islands.

16. The active matrix device of claim 15, wherein said active matrix device is used for an active matrix liquid crystal display incorporated in one of a digital still camera, electronic camera, a video movie capable of treating movie pictures, a portable personal computer, a car navigational system, a projection liquid crystal display and a video camera.

17. The active matrix device of claim 15, wherein said thin film transistor is a top gate thin film transistor.

18. The active matrix device of claim 15, wherein said thin film transistor is a bottom gate thin film transistor.

19. A semiconductor device having bottom-gate thin film transistors, comprising:

a semiconductor layer formed on an insulating surface;

an interlayer insulating film formed over said semiconductor layer;

a contact hole formed through said interlayer insulating film to expose a portion of said semiconductor layer therein;

an electrode electrically formed on said interlayer insulating film and contacting said semiconductor layer in said contact hole, wherein said semiconductor layer and said electrode are patterned in said contact hole coextensively, and wherein an area of said contact hole is larger than an area in which said electrode contacts the semiconductor layer.

20. The semiconductor device of claim 19, wherein said electrode does not overlap at least one edge of said contact hole.

21. The semiconductor device of claim 19, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

22. A semiconductor device comprising:

a gate electrode formed over a substrate;

a gate insulating film formed over said gate electrode;

a semiconductor layer having at least a channel region and a pair of impurity doped regions;

an interlayer insulating film formed over said gate electrode, said gate insulating film and said semiconductor layer;

an electrode formed on said interlayer insulating film and electrically connected with one of said pair if impurity doped regions of the semiconductor layer through a contact hole of said interlayer insulating film, wherein said semiconductor layer has a side surface in said contact hole, which is coplanar with a side surface of said electrode formed thereon, and wherein an area of said contact hole is larger than an area in which said electrode contacts said semiconductor layer.

23. The semiconductor device of claim 22, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

24. A semiconductor device comprising:

a thin film transistor formed over a substrate, said thin film transistor including at least:
  a semiconductor layer having at least a channel region and a pair of impurity doped regions, formed over a substrate;
  a gate insulating film formed on said channel region of the semiconductor layer; and
  a gate electrode formed over said channel region with said gate insulating film interposed therebetween;

an interlayer insulating film formed over said thin film transistor, said interlayer insulating film having at least one contact hole;

an electrode formed on said interlayer insulating film and electrically connected to one of said pair if impurity regions through said contact hole, wherein said semiconductor layer has a side surface in said contact hole, which is coplanar with a side surface of said electrode formed thereon, and wherein an area of said one contact hole is larger than an area in which said electrode contacts the semiconductor layer.

25. The semiconductor device of claim 24, wherein said semiconductor device is used for an active matrix liquid crystal display incorporated in one of a digital still camera, electronic camera, a video movie capable of treating movie pictures, a portable personal computer, a car navigational system, a projection liquid crystal display and a video camera.

26. A projector having an active matrix display device, said display device comprising:

a gate electrode formed over a substrate;

a gate insulating film formed over said gate electrode;

a semiconductor layer having at least a channel region and a pair of impurity doped regions;

an interlayer insulating film formed over said gate electrode, said gate insulating film and said semiconductor layer;

an electrode formed on said interlayer insulating film and electrically connected with one of said pair of impurity doped regions of the semiconductor layer through a contact hole of said interlayer insulating film, wherein said semiconductor layer has a side surface in said contact hole, which is coplanar with a side surface of said electrode formed thereon, and wherein an area of said contact hole is larger than an area in which said electrode contacts the semiconductor layer.

27. A projector having an active matrix display device, said display device comprising:

a thin film transistor formed over a substrate, said thin film transistor including at least:

a semiconductor layer having at least a channel region and a pair of impurity doped regions, formed over a substrate;

a gate insulating film formed on said channel region of the semiconductor layer; and a gate electrode formed over said channel region with said gate insulating film interposed therebetween;

an interlayer insulating film formed over said thin film transistor, said interlayer insulating film having at least one contact hole;

an electrode formed on said interlayer insulating film and electrically connected to one of said pair of impurity regions through said contact hole, wherein said semiconductor layer has a side surface in said contact hole, which is coplanar with a side surface of said electrode formed thereon, and wherein an area of said one contact hole is larger than an area in which said electrode contacts the semiconductor layer.

* * * * *